(12) United States Patent
Ma et al.

(10) Patent No.: US 11,996,473 B2
(45) Date of Patent: May 28, 2024

(54) FLEXIBLE TRANSISTORS WITH NEAR-JUNCTION HEAT DISSIPATION

(71) Applicant: Wisconsin Alumni Research Foundation, Madison, WI (US)

(72) Inventors: Zhenqiang Ma, Middleton, WI (US); Huilong Zhang, Madison, WI (US); Shaoqin Gong, Middleton, WI (US)

(73) Assignee: Wisconsin Alumni Research Foundation, Madison, WI (US)

( * ) Notice: Subject to any disclaimer, the term of this patent is extended or adjusted under 35 U.S.C. 154(b) by 0 days.

(21) Appl. No.: 17/938,378

(22) Filed: Oct. 6, 2022

(65) Prior Publication Data

US 2023/0170273 A1 Jun. 1, 2023

Related U.S. Application Data

(62) Division of application No. 16/862,825, filed on Apr. 30, 2020, now Pat. No. 11,495,512.

(51) Int. Cl.
| | |
|---|---|
| *H01L 29/737* | (2006.01) |
| *H01L 23/367* | (2006.01) |
| *H01L 23/522* | (2006.01) |
| *H01L 29/66* | (2006.01) |
| *H01L 29/732* | (2006.01) |
| *H01L 29/778* | (2006.01) |

(52) U.S. Cl.
CPC .......... *H01L 29/737* (2013.01); *H01L 23/367* (2013.01); *H01L 23/3672* (2013.01); *H01L 23/5226* (2013.01); *H01L 29/66242* (2013.01); *H01L 29/66318* (2013.01); *H01L 29/66431* (2013.01); *H01L 29/732* (2013.01); *H01L 29/7371* (2013.01); *H01L 29/7375* (2013.01); *H01L 29/778* (2013.01); *H01L 2924/13051* (2013.01)

(58) Field of Classification Search
CPC ......... H01L 2924/13051; H01L 29/737; H01L 29/7375; H01L 29/66242; H01L 29/66318; H01L 29/732; H01L 29/7371; H01L 23/5226
See application file for complete search history.

(56) References Cited

U.S. PATENT DOCUMENTS 5,296,389 A * 3/1994 Shimawaki ......... H01L 29/7327
257/E29.189
5,656,515 A * 8/1997 Chandrasekhar ..........................
H01L 29/66318
257/E29.189

(Continued)

FOREIGN PATENT DOCUMENTS

CN 101073149 A * 11/2007 ......... H01L 29/7304

*Primary Examiner* — Joseph C. Nicely
(74) *Attorney, Agent, or Firm* — Bell & Manning, LLC

(57) ABSTRACT

Flexible transistors and electronic circuits incorporating the transistors are provided. The flexible transistors promote heat dissipation from the active regions of the transistors while preserving their mechanical flexibility and high-frequency performance. The transistor designs utilize thru-substrate vias (TSVs) beneath the active regions of thin-film type transistors on thin flexible substrates. To promote rapid heat dissipation, the TSVs are coated with a material having a high thermal conductivity that transfers heat from the active region of the transistor to a large-area ground.

22 Claims, 27 Drawing Sheets

(56) References Cited

U.S. PATENT DOCUMENTS

| | | | | |
|---|---|---|---|---|
| 5,907,165 | A | * | 5/1999 | Hamm .............. H01L 29/66318 |
| | | | | 257/E29.189 |
| 6,294,018 | B1 | * | 9/2001 | Hamm .................. H01L 23/544 |
| | | | | 257/E21.387 |
| 6,310,368 | B1 | * | 10/2001 | Yagura .................. H01L 23/482 |
| | | | | 257/586 |
| 7,569,872 | B1 | * | 8/2009 | Rajavel ............. H01L 29/66318 |
| | | | | 257/197 |
| 2003/0082906 | A1 | * | 5/2003 | Lammert .......... H01L 21/76885 |
| | | | | 257/E21.589 |
| 2016/0141220 | A1 | * | 5/2016 | Watanabe ............... H01L 24/05 |
| | | | | 438/119 |

* cited by examiner

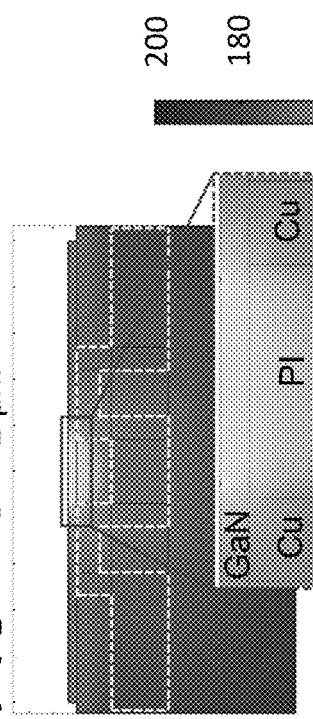
FIG. 4B  D = -4 μm
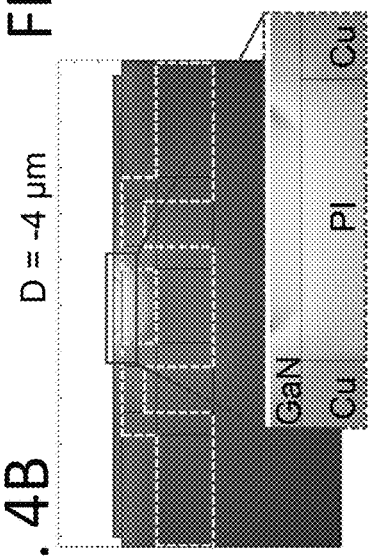
FIG. 4C  D = -2 μm
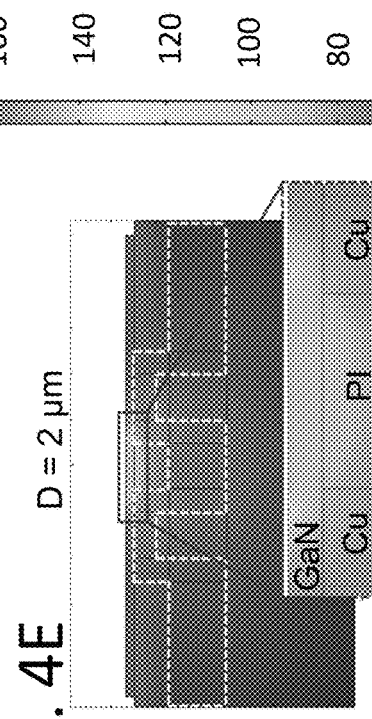
FIG. 4D  D = 0 μm
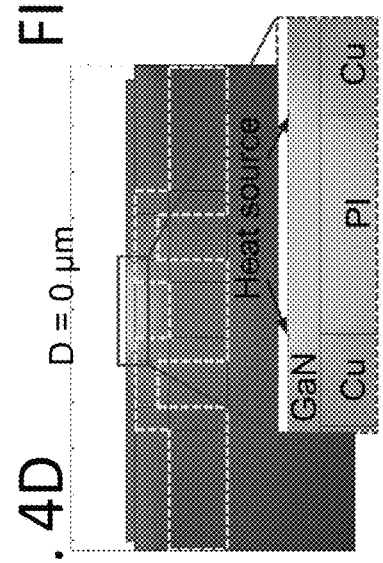
FIG. 4E  D = 2 μm
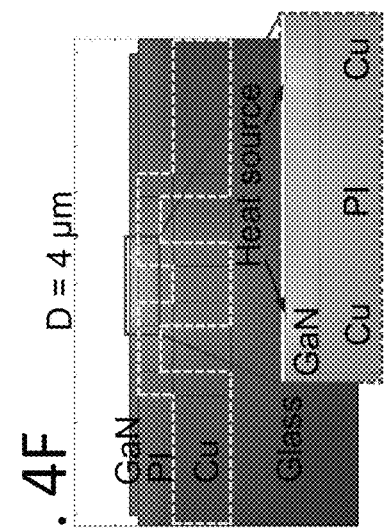
FIG. 4F  D = 4 μm

FIG. 12

FLEXIBLE TRANSISTORS WITH NEAR-JUNCTION HEAT DISSIPATION

CROSS REFERENCE TO RELATED APPLICATIONS

The present application is a divisional of U.S. patent application Ser. No. 16/862,825 that was filed Apr. 30, 2020, the entire contents of which are incorporated herein by reference.

REFERENCE TO GOVERNMENT RIGHTS

This invention was made with government support under N00014-18-1-2032 awarded by the NAVY/ONR, FA9550-19-1-0102 awarded by the USAF/AFOSR and 16-JV-11111106-052 awarded by the USDA/FS. The government has certain rights in the invention.

BACKGROUND

Flexible electronics have been rapidly advanced by applications like bio-medical devices, wearable devices, and conformal electronic systems in recent years. However, flexible electronics, especially flexible microwave electronics for wireless communication, have been limited to low-power applications, due to the degraded performance and reliability of flexible microwave transistors and circuits caused by poor heat dissipation on widely used low thermal conductivity flexible substrates. Efforts to improve high-power performance of flexible microwave electronics have primarily focused on exploiting different types of semiconductor materials and increasing the thermal conductivity of flexible substrates. Thin-film wide bandgap semiconductors, especially gallium nitride (GaN), have been extensively studied for reliable high-performance flexible microwave electronics due to their superb high-frequency high-power properties and excellent thermal reliability.

Flexible substrates with enhanced thermal conductivity have been developed for thermal management in flexible electronics. Adding high thermal conductivity fillers like carbon-based materials, h-BN, and alumina has been proven to be an effective way to increase thermal conductivity of flexible polymer substrates. However, due to the presence of the low thermal conductivity polymer materials between fillers, it is difficult to achieve a thermal conductivity as high as that of single crystalline semiconductor materials or metals. The improvement of thermal conductivity of flexible substrates also shows anisotropic properties due to the non-uniform distribution of fillers in the substrate or the anisotropic thermal properties of the fillers. In addition, low thermal conductivity adhesive layers that are typically used to bond thin-film transistors on flexible substrates can introduce huge extra thermal resistance.

Because single crystalline intrinsic GaN has high thermal conductivity, high-performance AlGaN/GaN high electron mobility transistors (HEMTs) have been demonstrated on large-area intrinsic GaN thin films, which effectively spreads the heat at the channel/junction to a large area and lowers the operating temperature of the GaN HEMT. However, the large-area membrane semiconductor used in this approach leads to high cost and low manufacturing yield. In another approach, directly bonding a membrane-based GaN HEMT to flexible copper film with a metal bonding layer has shown successful suppression of the self-heating effect in flexible GaN HEMTs. (Oh, S. K. et al. *Appl. Phys. Lett.* 111, (2017).) Despite the excellent DC performance of the flexible GaN HEMTs on copper film, which is comparable to that of a GaN HEMT on Si substrate, this approach is only suitable for applications at low frequency, due to the large parasitic capacitance between the GaN HEMT and the copper film.

SUMMARY

Flexible transistors and electronic circuits incorporating the transistors are provided. Also provided are methods of fabricating the flexible transistors.

One embodiment of a flexible field effect transistor includes: a source electrode; a drain electrode; a semiconductor structure comprising one or more layers of semiconductor material, wherein the semiconductor structure defines a channel that extends from the source electrode to the drain electrode and provides electrical communication between the source electrode and the drain electrode; and a gate electrode in electrical communication with the channel, wherein the gate electrode is configured to apply a gate voltage across the channel to modulate current flow through the channel. A dielectric polymer substrate having an upper surface and a lower surface is mounted to the semiconductor structure and a via underlying the portion of the channel extending from the source electrode to the gate electrode is defined in the dielectric polymer substrate. The via extends from the lower surface to the upper surface of the dielectric polymer substrate, such that a surface of the semiconductor structure is exposed through the via. A thermally conductive film in contact with the lower surface of the dielectric polymer substrate, the sidewalls of the via, and the surface of the semiconductor structure that is exposed through the via provides heat dissipation.

One embodiment of a method of forming a flexible field effect transistor includes providing a transistor, the transistor having: a source electrode; a drain electrode; a semiconductor structure comprising one or more layers of semiconductor material, wherein the semiconductor structure defines a channel extending from the source electrode to the drain electrode that provides electrical communication between the source electrode and the drain electrode; and a gate electrode in electrical communication with the channel, wherein the gate electrode is configured to apply a gate voltage across the channel to modulate current flow through the channel. The method further includes the steps of providing a dielectric polymer substrate having an upper surface and a lower surface; mounting the upper surface of the dielectric polymer substrate to the semiconductor structure; forming a via underlying at least the portion of the channel extending from the source electrode to the gate electrode in the dielectric polymer substrate, the via extending from the lower surface to the upper surface of the dielectric polymer substrate, such that a surface of the semiconductor structure is exposed through the via; and depositing a thermally conductive film on the lower surface of the dielectric polymer substrate, the sidewalls of the via, and the surface of the semiconductor structure that is exposed through the via.

One embodiment of a heterojunction bipolar transistor includes a mesa stack having: a collector; an emitter; and a base disposed between the collector and the emitter. The heterojunction bipolar transistor further includes a collector contact in electrical communication with the collector; an emitter contact over the emitter; and base contact in electrical communication with the base. A dielectric polymer layer encapsulates the mesa stack. The dielectric polymer layer has an upper surface and a lower surface that is in contact with the emitter contact. A via overlying the emitter is defined in the dielectric polymer layer, the via extending from the upper surface to the lower surface of the dielectric polymer layer, such that a surface of the emitter contact is exposed through the via. A thermally conductive film in contact with the upper surface of the dielectric polymer layer, the sidewalls of the via, and the surface of the emitter contact that is exposed through the via provides heat dissipation.

One embodiment of a method of forming a heterojunction bipolar transistor includes providing a transistor that includes: a mesa stack having a collector, an emitter, and a base disposed between the collector and the emitter; a collector contact in electrical communication with the collector; an emitter contact over the emitter; and base contact in electrical communication with the base. The method further includes the steps of encapsulating the mesa stack with a dielectric polymer layer having an upper surface and a lower surface, wherein the lower surface is in contact with the emitter contact; forming a via overlying at least the portion of the emitter in the dielectric polymer layer, the via extending from the upper surface to the lower surface of the dielectric polymer layer, such that a surface of the emitter contact is exposed through the via; and depositing a thermally conductive film on the upper surface of the dielectric polymer layer, the sidewalls of the via, and the surface of the emitter that is exposed through the via.

Other principal features and advantages of the invention will become apparent to those skilled in the art upon review of the following drawings, the detailed description, and the appended claims.

BRIEF DESCRIPTION OF THE DRAWINGS

Illustrative embodiments of the invention will hereafter be described with reference to the accompanying drawings, wherein like numerals denote like elements.

FIGS. 1A and 1B show schematic illustrations of heat transfer in a conventional flexible GaN HEMT (FIG. 1A) and the proposed flexible GaN HEMT (FIG. 1B). The straight arrows along the lateral dimension represent heat flow in the device. FIG. 1C shows a SEM image of thru-substrate via (TSV) using the proposed heat dissipation strategy after electroplating the copper layer. FIG. 1D shows a schematic view of the flexible microwave amplifier. Microstrip transmission lines and MIM capacitors were used for passive components in the amplifier. The scale bar in FIG. 1C is 20 μm.

FIG. 2A shows a flexible GaN HEMT made by bonding the transistor directly onto a planar metal (e.g., Cu) film. FIG. 2B shows a flexible GaN HEMT made using the transistor design described herein.

FIGS. 3A and 3B show temperature distribution of a flexible AlGaN/GaN HEMT on engineered PI substrate with TSVs (FIG. 3A) and on conventional PI substrate with no via (FIG. 3B) through FEA study. Upper inset schematics illustrate cross-sections of the structure in the FEA study. Magnified views of surface temperature distribution of the flexible GaN HEMTs are inserted at upper right. Dashed lines across the magnified views illustrate the position of the cross-section views shown on bottom left. FIG. 3C shows a comparison of DC characteristics of a flexible GaN HEMT on engineered PI substrate with TSV and on conventional PI substrate without TSV. The HEMT on engineered PI shows higher DC current and suppressed self-heating effect. The measurements were conducted with drain electrode biased at 10 V and gate biased at −1 V. FIG. 3D shows drain current density ($I_{DS}$) of the flexible AlGaN/GaN HEMT on engineered PI with TSV as a function of drain bias voltage when gate is biased at −1V, 0V, and 1V. The HEMT shows as high as ~700 mA/mm DC current.

FIGS. 4A-4H show thermal analysis of flexible GaN HEMTs on engineered polyimide (PI) substrates. FIG. 4A shows the definition of distance between the sidewall of TSV and the drain electrode. Three cases for distance (D) smaller than, equal to, and larger than 0 are displayed. FIGS. 4B-4F show cross-section temperature distribution of the flexible GaN HEMT on engineered polyimide substrates with various distance between the sidewall of TSV and the drain electrode (D) from −4 μm to 4 μm. Magnified insets show the temperature distribution around heat sources. FIG. 4G shows temperature rise as a function of distance (D) extracted from FIGS. 4B-4F. FIG. 4H shows temperature rise as function of dissipated power density with various distance (D). Temperature rise is defined as: highest temperature—environmental temperature (20° C., here).

FIG. 5A shows a flexible GaN HEMT on engineered PI substrate. The fabrication started from transfer-printing a 200 μm×200 μm thin-film GaN HEMT from a PDMS stamp on a PI/PMMA/Si substrate using partially cured PI as an adhesive layer. Electrodes of the HEMT were exposed using RIE dry etching, and interconnect metal for probing was subsequently deposited. The device on PI thin film was mechanically laminated on a PDMS stamp, and TSV was formed in the PI layer at defined locations by RIE. A layer of Ni/Cu was sputtered as a seed layer, and a thick Cu layer was electroplated. The sample was delaminated from the PDSM stamp for further characterization. FIG. 5B shows a flexible GaN HEMT on conventional PI substrate. The transfer-printing of the thin-film GaN HEMT and deposition of interconnect metal is the same as the process for fabricating flexible GaN HEMT on engineered polyimide substrate. The HEMT on PI thin film with interconnect metal was delaminated from Si substrate for further characterization.

FIGS. 6A and 6B show optical microscopic images (FIG. 6A) and a SEM image (FIG. 6B) of the flexible GaN HEMT on engineered PI substrate with normal size TSVs. The magnified view in FIG. 6A shows the active region of the flexible GaN HEMT. The TSVs cover source electrodes and a channel region with D of ~3 μm. FIGS. 6C-6E show measured MAG/MSG, unilateral gain (U), and current gain ($H_{21}$) curves of the flexible GaN HEMTs on engineered PI substrates with normal size TSVs (FIG. 6C), on engineered PI substrate with large TSVs (FIG. 6D), and on ~127 μm Kapton film (FIG. 6E), respectively. Measurements were conducted when the flexible GaN HEMTs laminated on a flat metal stage. FIGS. 6F and 6G show measured MAG/MSG, unilateral gain (U), and current gain ($H_{21}$) curves of the flexible GaN HEMTs on engineered PI substrates with normal size TSVs laminated on bent metal fixtures with bending radius of 28.5 mm (FIG. 6F) and 15.5 mm (FIG. 6G), respectively. FIG. 6H shows a comparison of MAG/

Figure 6A:
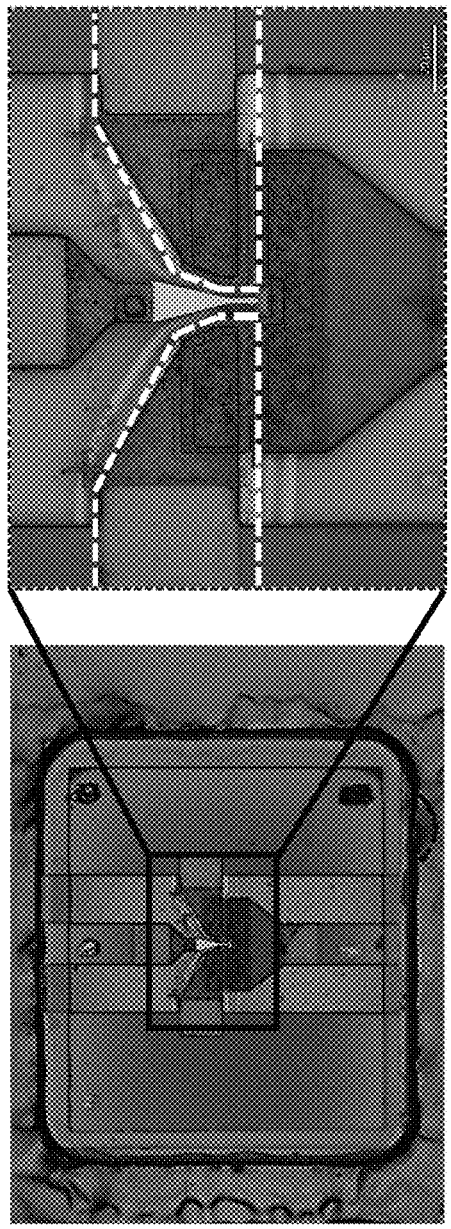
FIGS. 6A-6H show RF characterization of a flexible GaN HEMT.
Figure 6B:
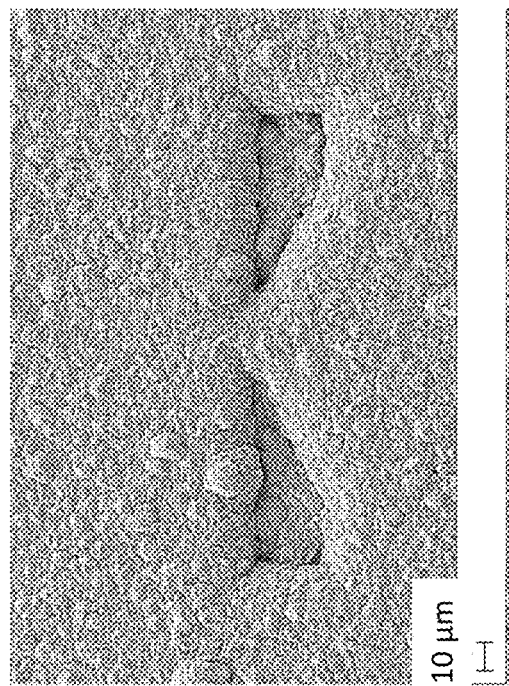
Figure 6D:
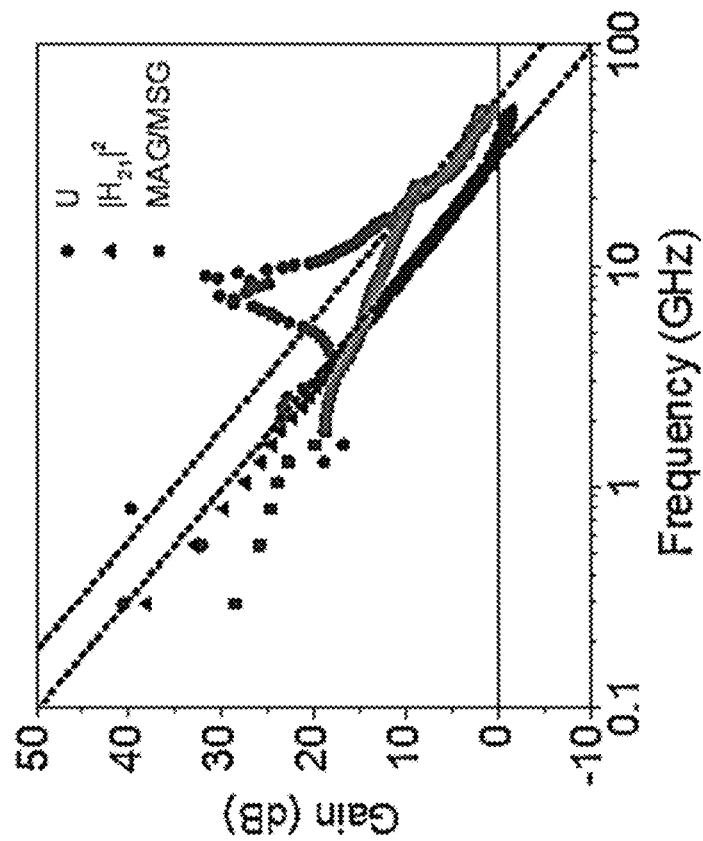
Figure 6C:
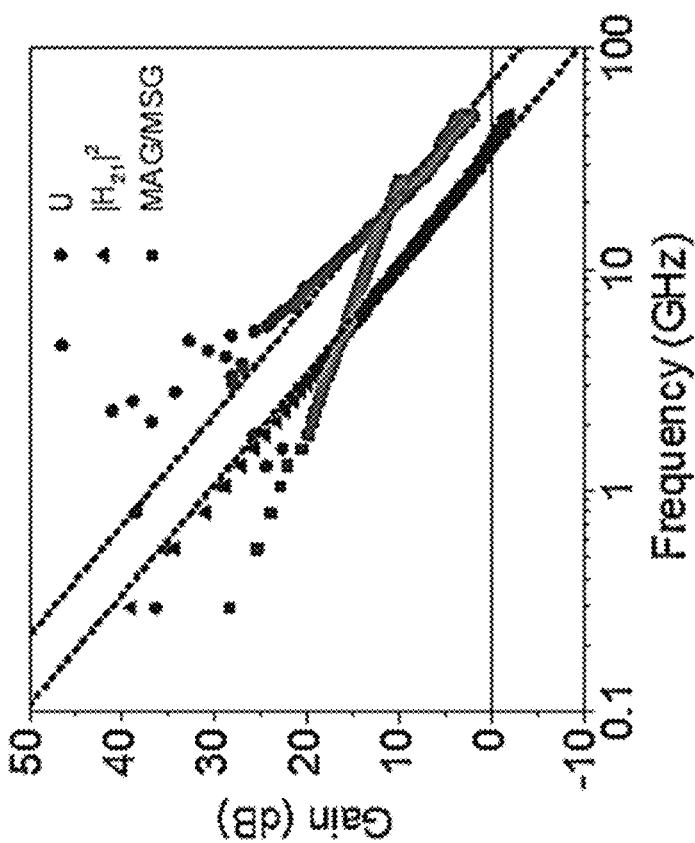
Figures 6E, 6F:
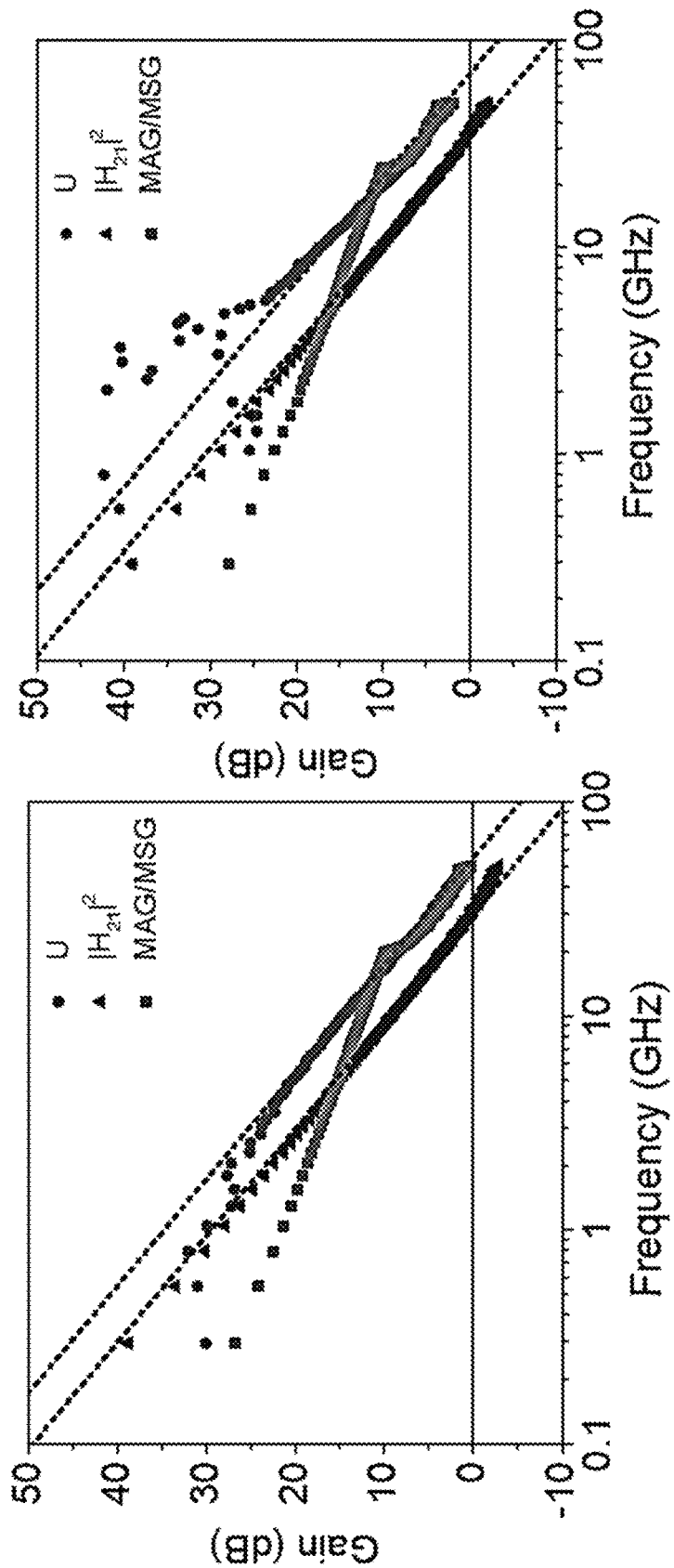
Figure 6H:
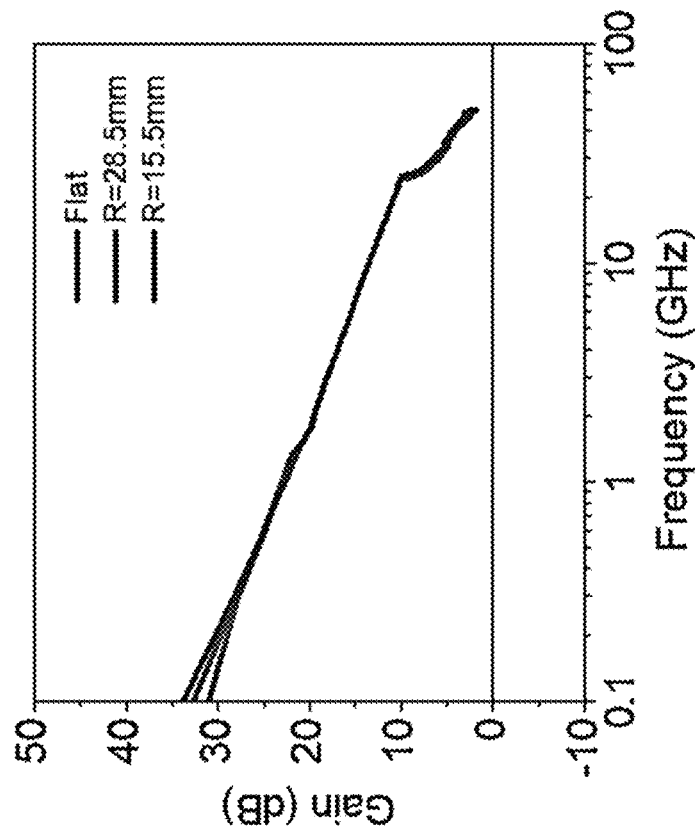
Figure 6G:
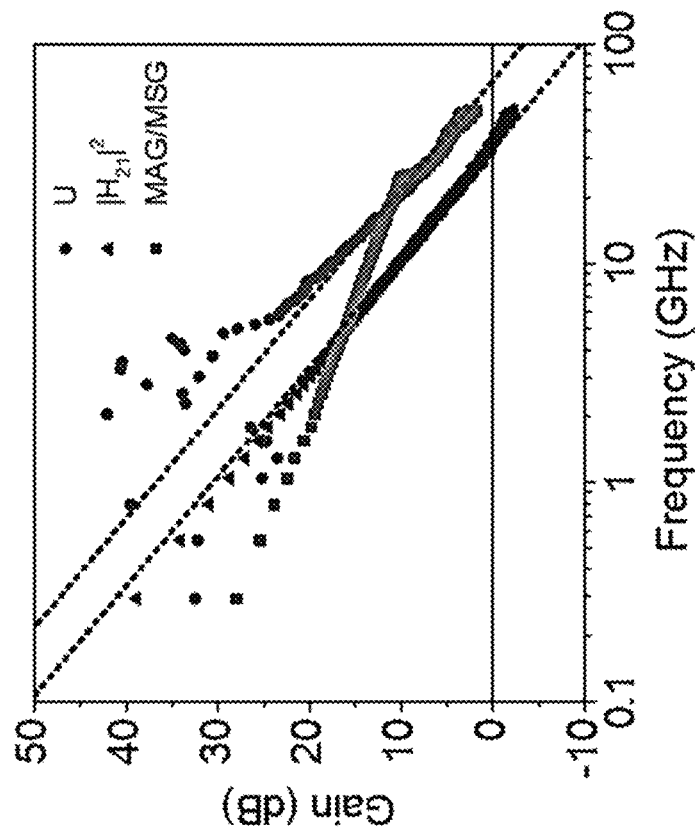

MSG curves in FIG. 6C, FIG. 6F, and FIG. 6G. Scale bars and inset images of FIGS. 6A-6B are 100 μm and 20 μm, respectively.

Figure 7:
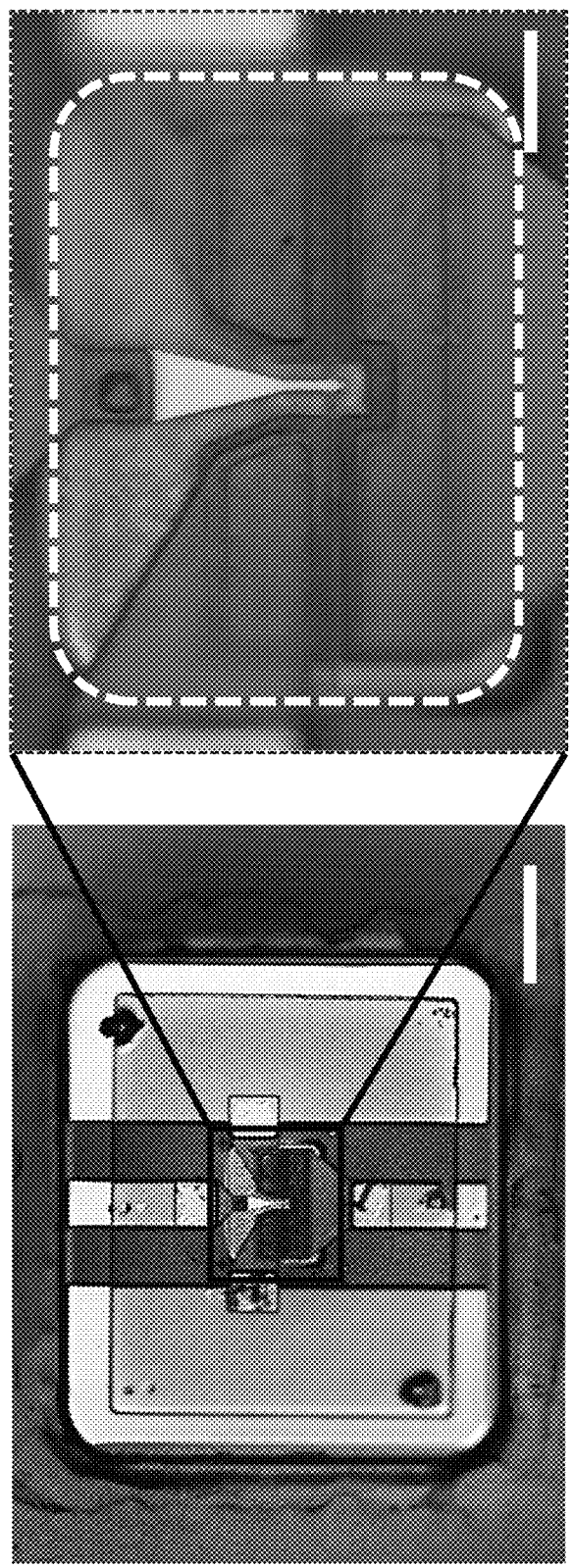

FIG. 7 shows optical microscopic images of GaN HEMT on engineered PI substrate with large TSV. The thin-film GaN HEMT in PI substrate on PDMS is shown after electroplating copper. The scale bar is 100 μm. The scale bar in the magnified view is 20 μm. Dashed lines in the magnified view denote the edges of the TSV.

Figure 8A:
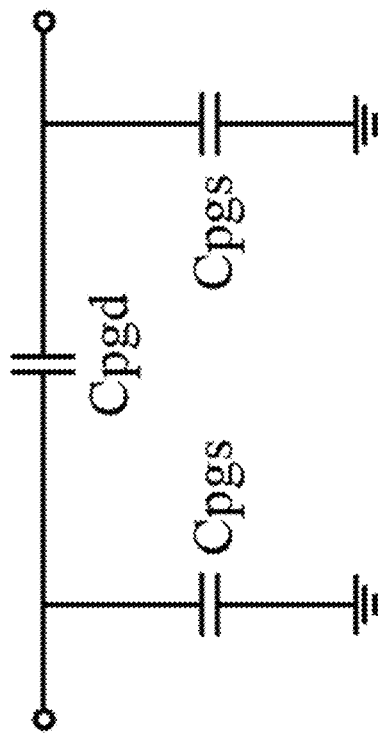
Figure 8C:
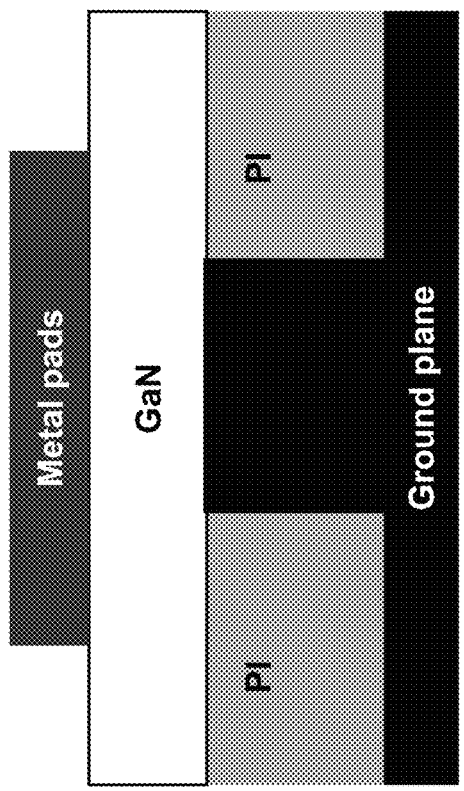
Figure 8B:
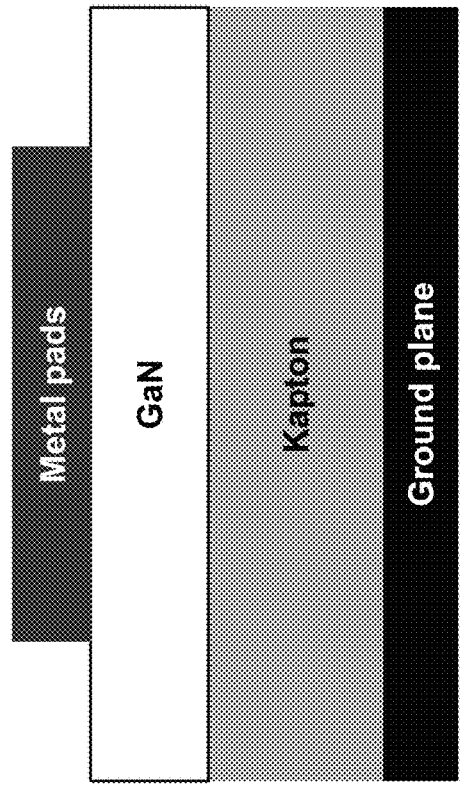
Figure 8F:
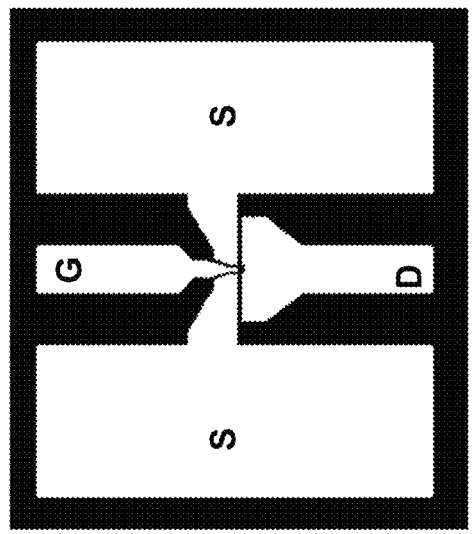
Figure 8E:
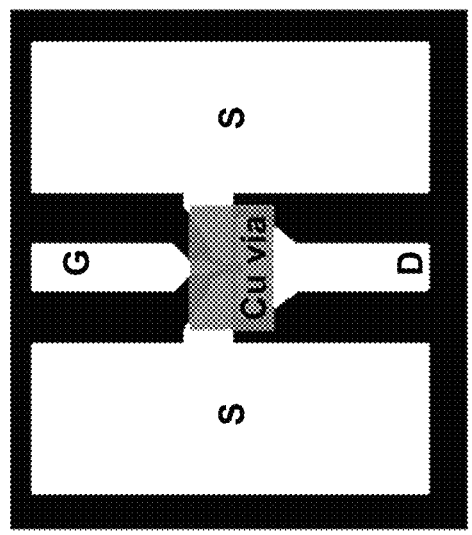
Figure 8D:
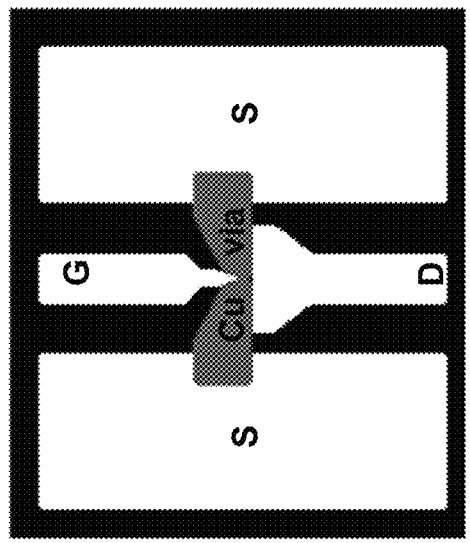
Figure 8H:
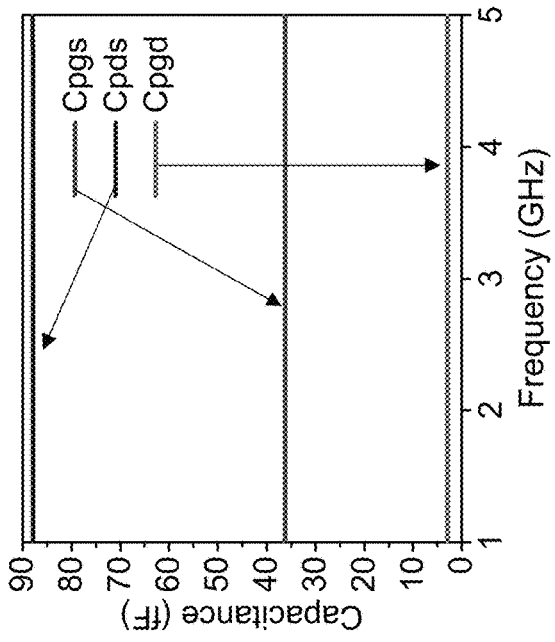
Figure 8G:
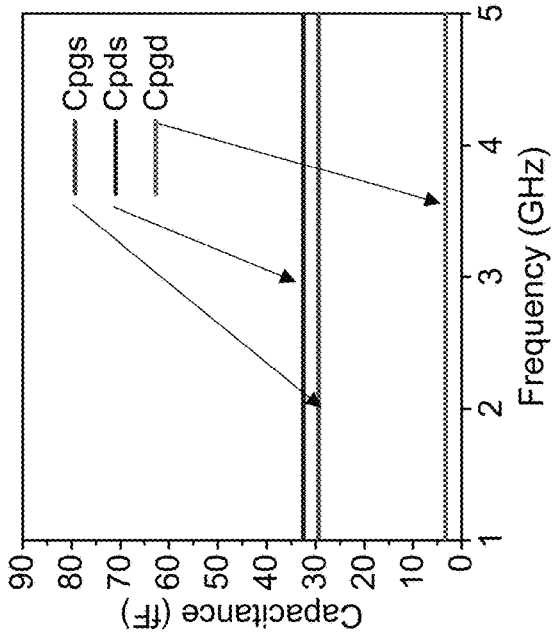
Figure 8I:
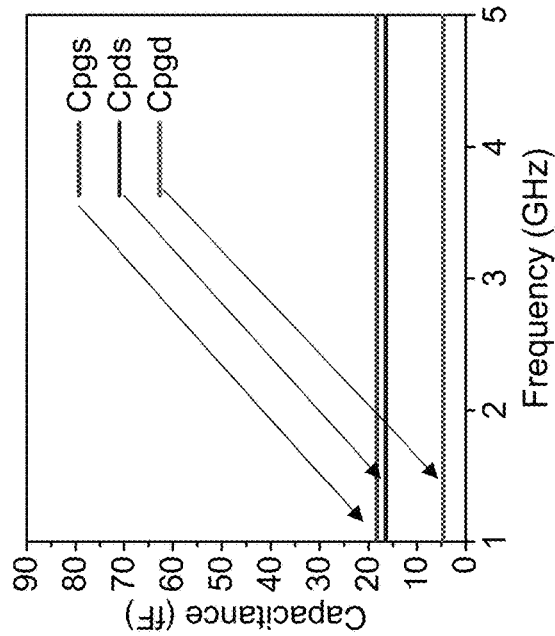

FIGS. 8A-8I show the study of parasitic capacitance of flexible GaN HEMTs using EM simulation. FIG. 8A shows a schematic equivalent circuit of metal pads of GaN HEMT. FIGS. 8B-8C show cross-section schematics of simulated metal pads on 127 μm Kapton (FIG. 8B) and on engineered PI substrates (FIG. 8C). FIGS. 8D-8F show layouts of simulated metal pads on engineered PI substrates with normal size TSV (FIG. 8D), large size TSV (FIG. 8E), and 127 μm Kapton (FIG. 8F). FIGS. 8G-8I show extracted parasitic capacitance from simulation results of layouts shown in FIGS. 8D-8F.

Figure 9A:
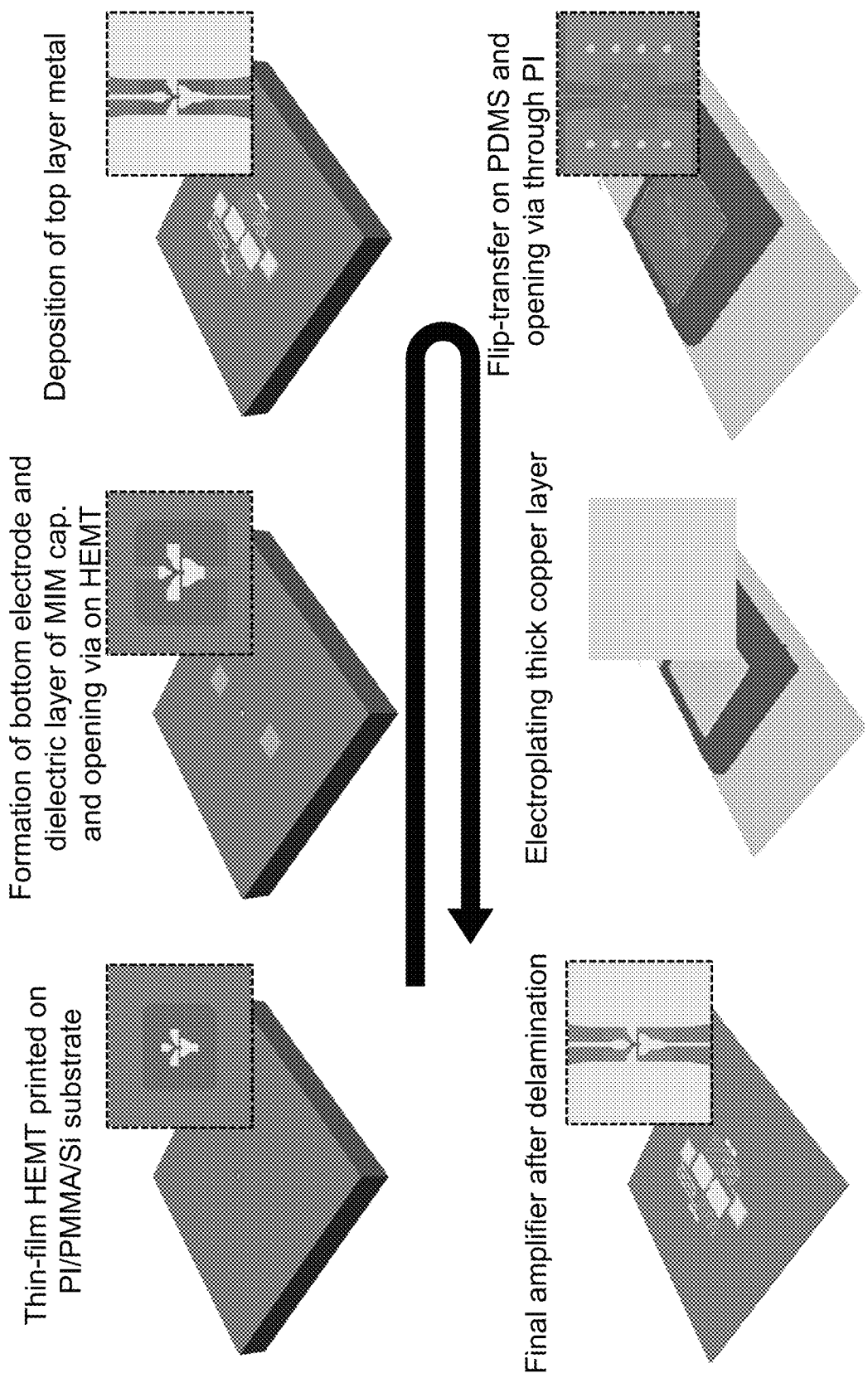
Figure 9B:
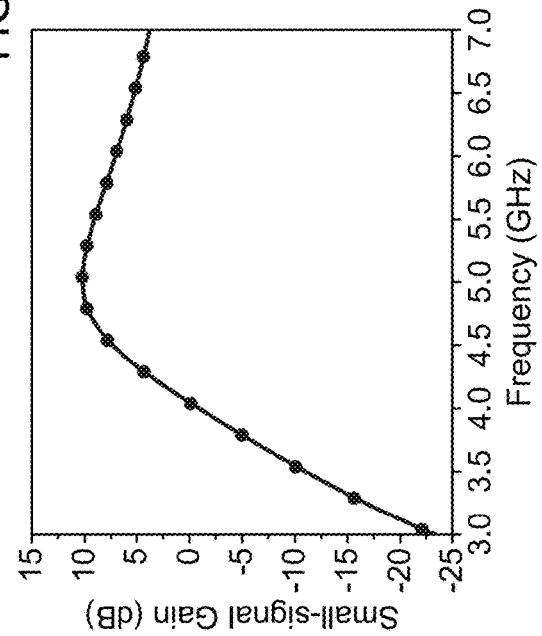
Figure 9D:
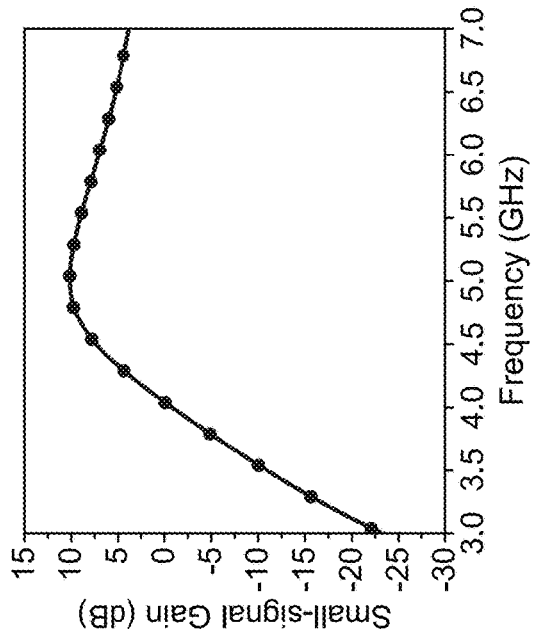
Figure 9C:
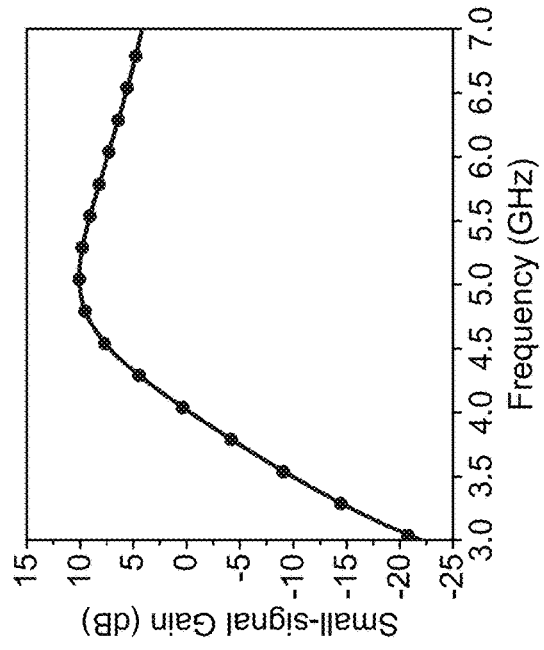
Figure 9E:
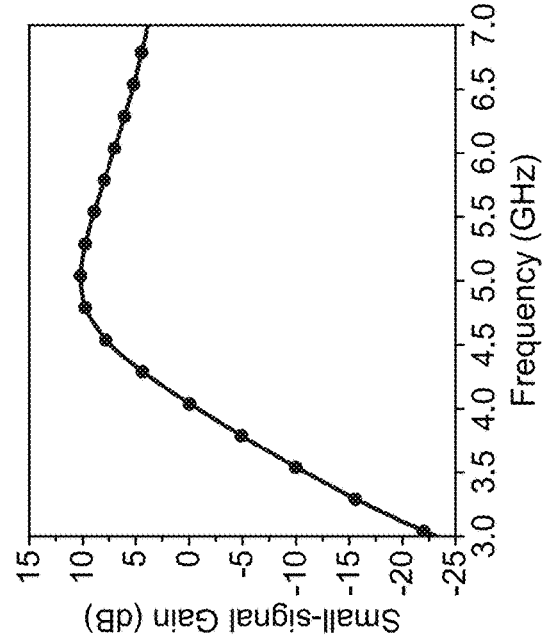

FIGS. 9A-9I show fabrication and characterization of the flexible microwave amplifier. FIG. 9A is a schematic illustration of a fabrication procedure of the thin-film flexible microwave amplifier, which includes the following: transfer-printing membrane HEMT on temporary PI/PMMA/Si substrate, depositing bottom electrodes of MIM capacitors and spin-casting a PI insulating layer, etching shallow via holes through the PI insulating layer and depositing a top-layer metal, picking up the flexible microwave amplifier in polyimide thin film using a PDMS stamp and etching deep via holes through the polyimide thin film, sputtering a Ni/Cu seed layer and electroplating a copper ground plane, and releasing the flexible microwave amplifier from the PDMS stamp. FIGS. 9B-9E show measured small-signal gains of the flexible microwave amplifier on flat high frequency laminate before large-signal RF characterization on a flat metal surface with R of 28.5 mm, and on a bent metal surface with R of 15.5 mm after large-signal RF characterization. The amplifier was biased at drain voltage of 10 V and gate voltage of -2.2 V for all testing cases. FIGS. 9F-9I show output RF power ($P_{OUT}$), power-added efficiency (PAE), and power gain (Gain) of the flexible microwave amplifier as a function of input RF power ($P_{IN}$) at 5 GHz on a bent metal surface with R of 28.5 mm, 15.5 mm, and on flat high frequency laminate.

Figure 10:
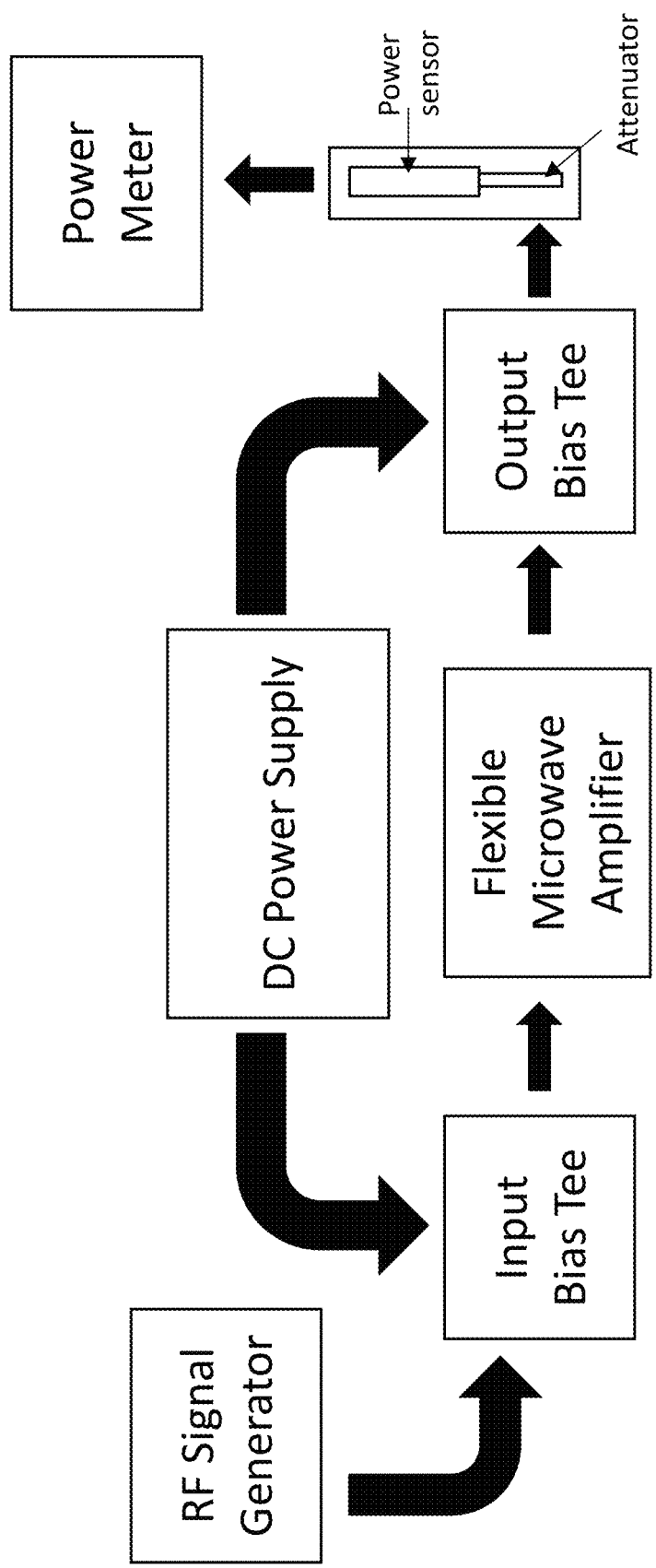

FIG. 10 shows a large-signal measurement setup. A microwave signal was generated by the microwave signal generator (HP 83592B, Keysight) and combined with DC bias voltage (Agilent E3631A, Keysight) through an input bias tee (HP 11590B, Keysight). The flexible microwave amplifier was connected to the system through a microwave probe (Infinity Probe, Cascade Microtech). The output from the flexible amplifier was connected to an output bias tee (HP 11590B, Keysight) which applied drain bias voltage to the AlGaN/GaN HEMT. After attenuation (MOD 20600-6, Omni Spectra), output RF power was monitored by a microwave power meter (EPM-442A, Keysight) through a power sensor (HP 8481A, Keysight).

Figure 11:
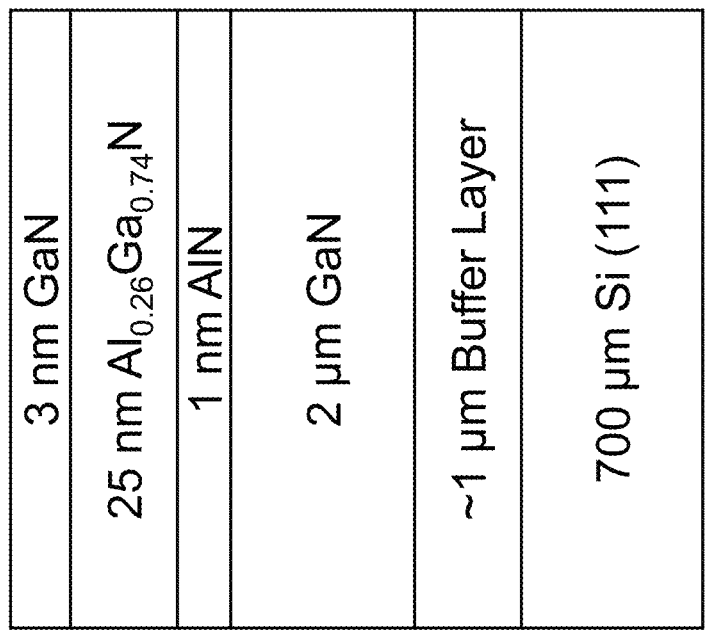

FIG. 11 shows a schematic illustration of the structure of an AlGaN/GaN epilayer on a Si wafer.

Figure 12:
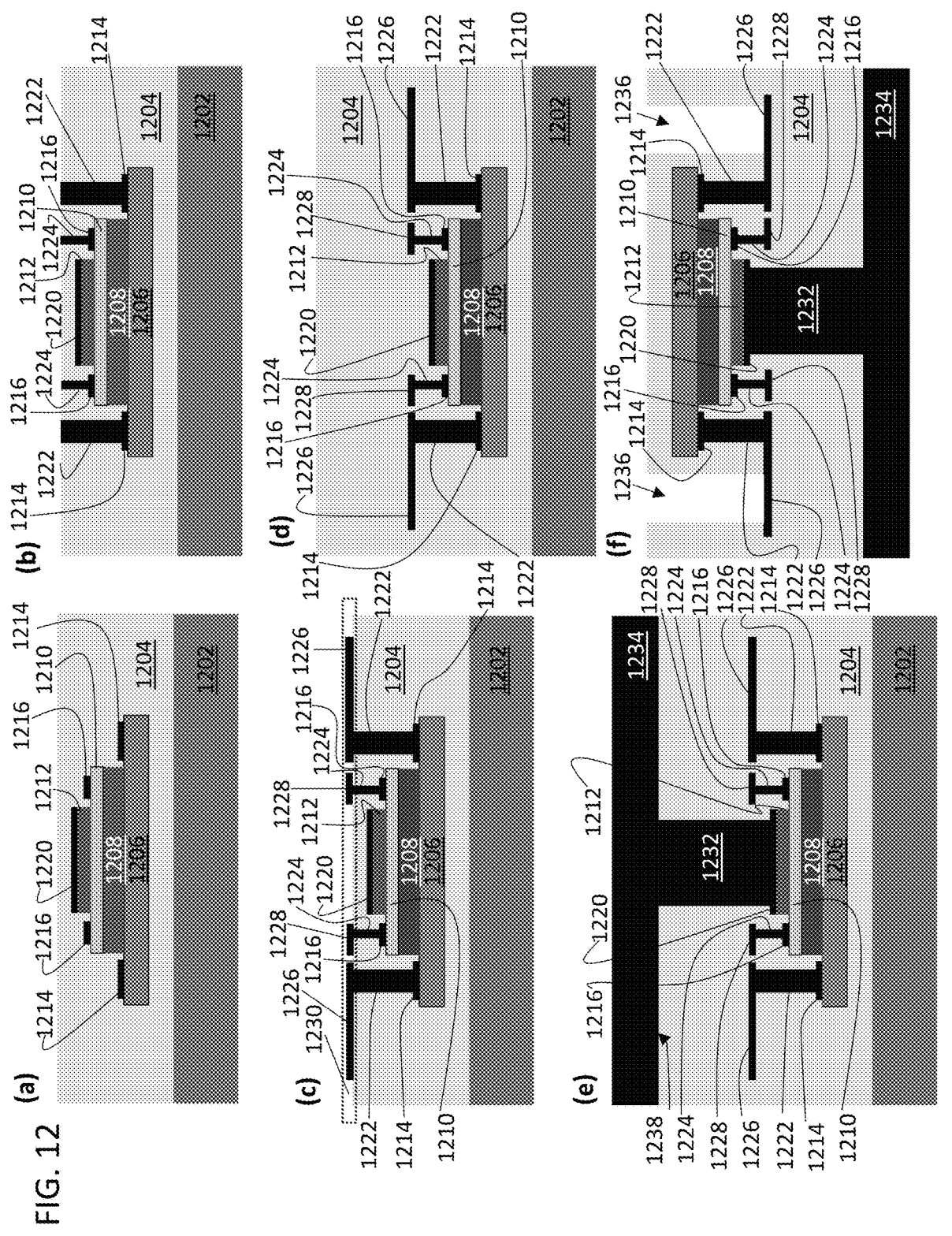

FIG. 12 shows the fabrication process for HBT with thermally conductive material-coated TSV heat dissipation.

DETAILED DESCRIPTION

Flexible transistors and electronic circuits incorporating the transistors are provided. Also provided are methods of fabricating the flexible transistors.

The flexible transistors are designed to promote heat dissipation from the transistor active regions, while preserving their mechanical flexibility and high-frequency performance. The flexible transistors utilize thru-substrate vias (TSVs) beneath the grounded electrodes of thin-film type transistors on thin flexible substrates. To promote rapid heat dissipation, the TSVs are coated with a material having a high thermal conductivity that transfers heat from the active region of the transistor to a large-area ground. By providing an interface between the highly thermally conductive coating and a semiconductor having a high thermal conductivity, such as GaN, the transistor designs described herein result in lower thermal resistance than conventional thin-film based flexible transistors.

The transistor designs can be implemented in different types of solid-state thin film transistors that experience undesirable heating around their active regions that limits device performance, including field effect type transistors and heterojunction bipolar transistors (HBTs). For example, in field effect type transistors, such as microwave HEMTs and Metal Oxide Semiconductor Field Effect Transistors (MOSFETs) on flexible polymeric substrates, heat generated in the transistor concentrates at the active region between the source and drain electrodes, which degrades performance. Similarly, in an HBT on flexible polymeric substrates, heat concentrates at or near the collector junction, which degrades performance.

Figure 1B:
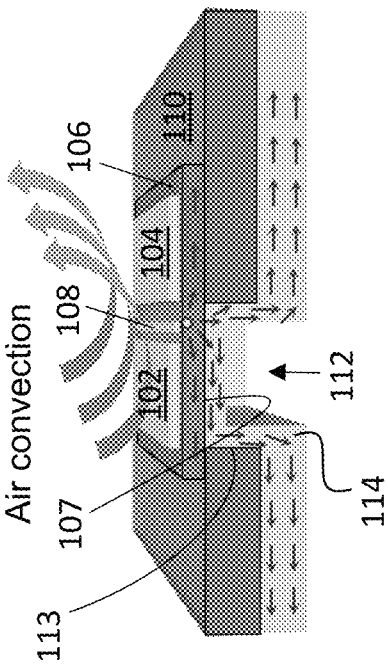
FIGS. 1A-1D show heat dissipation of a flexible GaN HEMT and flexible microwave circuits.

The use of a via lined with a thermally conductive material underlying the active region to improve thermal management in a HEMT having a grounded source is illustrated schematically in FIG. 1B. For comparison, thermal management in a conventional HEMT is presented in FIG. 1A.

Figure 1A:
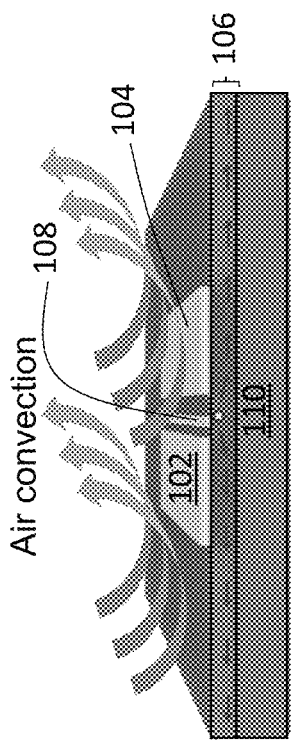

As shown in FIGS. 1A and 1B, the transistor includes a source electrode 102, a drain electrode 104, and a semiconductor structure 106 that provides electrical communication between source electrode 102 and drain electrode 104 by defining a channel for current flow between the source electrode and the drain electrode. A gate electrode 108 is placed in electrical communication with the channel, such that current flow through the channel is modulated by the application of a gate voltage to gate electrode 108. Semiconductor structure 106 is mounted to a flexible dielectric polymer substrate 110. In the HEMTs of FIG. 1A and FIG. 1B, heat may be dissipated by air convection (larger curved arrows), as well as laterally through the semiconductor structure (smaller arrows).

In the HEMT of FIG. 1B, a via 112 is defined in polymer substrate 110 below source electrode 102 and gate electrode 108. Via 112 can be formed using, for example, plasma etching or laser cutting. The sidewalls 113 of via 112 extend from the lower surface to the upper surface of polymer substrate 110, such that a portion of the surface 107 of semiconductor structure 106 is exposed through via 112. Sidewalls 113 of via 112, the exposed surface 107 of semiconductor structure 106, and the lower surface of polymer substrate 110 are coated with a film 114 of thermally conductive material. Via 112 is sized and positioned so that it underlies some or all of source electrode 102 and the portion of the channel that extends between source electrode 102 and gate electrode 108. As shown in FIG. 1B, via 112 may, optionally, further extend under gate electrode 108 and the portion of the channel that extends from gate electrode 108 to drain electrode 104 and may still further extend under at least a portion of drain electrode 104. However, as discussed in more detail below, the extent to which via 112 extends under drain electrode 104 is limited in order to reduce, minimize, or avoid parasitic capacitance associated with the drain electrode. As represented by the lowest set of arrows in FIG. 1B, film 114 provides an additional, highly efficient heat transport channel, which allows the transistor to operate at high frequencies without overheating.

Depending upon the type of transistor being employed, semiconductor structure 106 can be composed of a single layer of semiconductor material or may include two or more layers of different semiconductors. Typically, the layers will be single-crystalline. For example, in a HEMT (also known as a heterostructure field effect transistor), the semiconductor structure includes a heterojunction between two semiconductors having different bandgaps, wherein the heterojunction defines the channel. By way of illustration, some embodiments of microwave HEMTs utilize heterojunctions between different group III-nitride wide bandgap semiconductors, such as AlGaN/GaN layers, to provide a channel. However, other semiconductors, such as other Group III-V semiconductors, can be used to form the heterojunction. These include GaInP/GaAs, AlGaAs/GaAs, InAlAs/InGaAs and InP/InGaAs heterojunctions.

Alternatively, in a MOSFET the semiconductor structure includes doped regions within a layer of semiconductor to define a channel. Many MOSFETs use a single crystal Group IV semiconductor, such as silicon, with n-type doped regions located below the source electrode and drain electrode as the semiconductor structure that provides the transistor channel. By way of illustration, one such MOSFET is described in Seo, Jung-Hun, et al "Transferrable single-crystal silicon nanomembranes and their application to flexible microwave systems." *Journal of Information Display* 12.2 (2011): 109-113.

In addition to the active, channel-defining semiconductor layer or layers, semiconductor structure 106 may include other layers, such as a growth substrate and one or more buffer layers that facilitate the epitaxial growth of the active, channel-defining semiconductor layers on the growth substrate. While these additional layers can be retained in the transistor, it is desirable to partially or fully remove them from the semiconductor structure prior to mounting the semiconductor structure to the polymeric substrate. The one or more layers that make up semiconductor structure 106 are desirably thin enough to render the transistor mechanically flexible. The mechanically flexible transistors are able to operate and fulfill their intended purpose even when they are flexed, bent, rolled, and/or twisted. Typically, the semiconductor structure will have a thickness of 10 µm or less (e.g., a thickness in the range from 500 nm µm to 5 µm).

Dielectric polymer substrate 110 is a flexible polymeric material that provides electrical insulation. Suitable polymers include those having a dielectric constant of 4 or lower as measured, for the purpose of this disclosure, at 1 kHz. In addition, the polymer is desirably, but not necessarily, transparent to visible light in order to enable visual inspection of the alignment of the via during fabrication. Polyimide and Kapton are examples of polymers that have a sufficiently low dielectric constant and are transparent in the visible region of the electromagnetic spectrum. Polyethylene terephtalate (PET), parylene, polyethylene naphthalate, and liquid crystal polymers are other examples of suitable polymer dielectrics. The polymer substrate should be thick enough to provide electrical insulation below the drain electrode—either by itself or in combination with an insulating inorganic layer at the bottom of the semiconductor structure, but thin enough to provide adequate flexibility for a given device application. By way of illustration, polymer film thicknesses in the range from 5 µm to 500 µm, including from 10 to 200 µm, are generally suitable, although thicknesses outside of these ranges can be used. Polymer substrate 110 may be bonded to semiconductor structure 106 using a coating of adhesive, such as an epoxy adhesive or a silicone adhesive, between the polymer substrate and the semiconductor structure. If an adhesive coating is used, via 112 should extend through the adhesive coating as well as the polymer substrate.

As used herein the term "thermally conductive material" is defined as a material having a thermal conductivity that is higher than that of the polymeric dielectric. Generally, the thermally conductive material will have a thermal conductivity of at least 5 $Wm^{-1}K^{-1}$. This includes materials having a thermal conductivity of at least 10 $Wm^{-1}K^{-1}$, thermal conductivity of at least 50 $Wm^{-1}K^{-1}$, a thermal conductivity of at least 100 $Wm^{-1}K^{-1}$, and a thermal conductivity of at least 200 $Wm^{-1}K^{-1}$. However, for applications where thermal management is particularly important, the thermally conductive material desirably has a thermal conductivity of at least 250 $Wm^{-1}K^{-1}$ and more desirably at least 300 $Wm^{-1}K^{-1}$ (e.g., in the range from 10 $Wm^{-1}K^{-1}$ to 600 $Wm^{-1}K^{-1}$. The film of thermally conductive material inside the via will most commonly be a metal, such as copper (~385 $Wm^{-1}K^{-1}$) or gold (~314 $Wm^{-1}K^{-1}$) or a metal alloy. However, other thermally conductive materials can also be used. These include diamond or diamond-like materials and thermally conductive inorganic nitrides, such as aluminum nitride (AlN). Generally, good candidates for the thermally conductive material are able to be formed into a mechanically flexible film so as not to impede the flexibility of the transistor. Because thin films are typically more flexible, various illustrative embodiments of film 114 have a thickness of 100 µm or less, including a thickness of 50 µm or less, and further including a thickness of 25 µm or less. By way of illustration, films having thicknesses in the range from 10 µm to 50 µm may be used. However, thicker films can be used as long as they provide the desired degree of flexibility. Thin films of the thermally conductive material will conform to the shape of the interior surfaces of the via. Thicker films may completely fill the via. However, filled vias may render the overall structure less flexible and, therefore, thin conformal films may be more desirable. The film of thermally conductive material can be deposited on the surface of the semiconductor structure that is exposed through the via, on the sidewalls of the via, and on the lower surface of the polymer substrate using techniques such as electrodeposition, inkjet printing, screen printing, sputtering, or other techniques that can form a conformal coating. Optionally, and additional film of the same, or a different, thermally conductive material, such as a metal foil, can be pre-fabricated and then applied over at least a portion of the previously applied conformal thermally conductive coating in order to further enhance heat transfer. The application of the additional film can be accomplished using, for example, a coating of an adhesive.

Figure 2A:
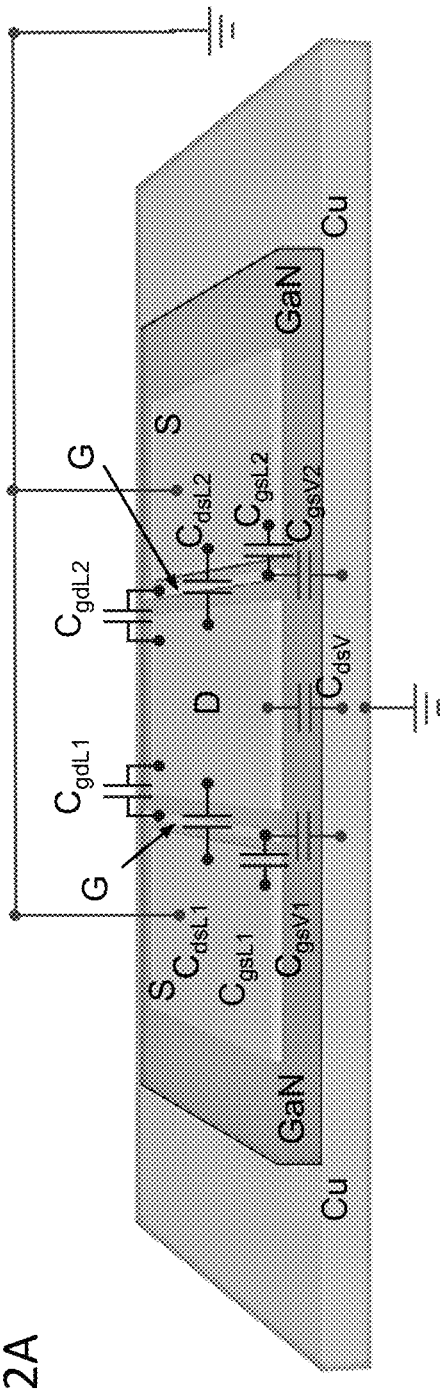
FIGS. 2A-2B show schematic illustrations of parasitic capacitance of the flexible GaN HEMTs when they are used in common source configuration.
Figure 2B:
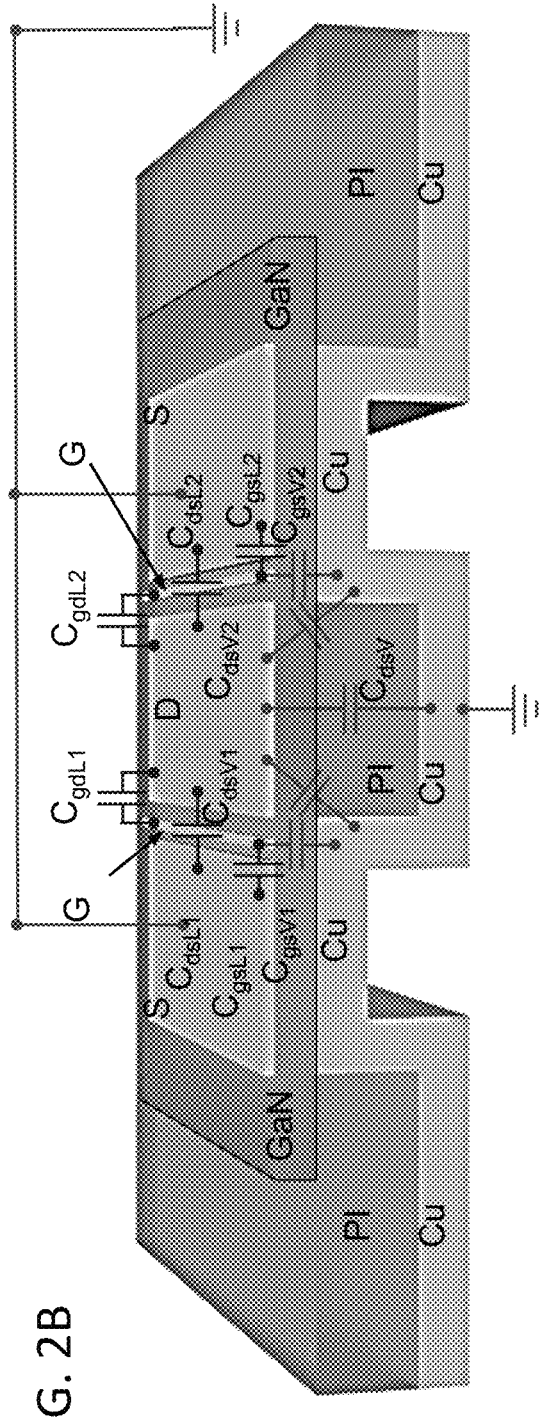
Figure 4A:
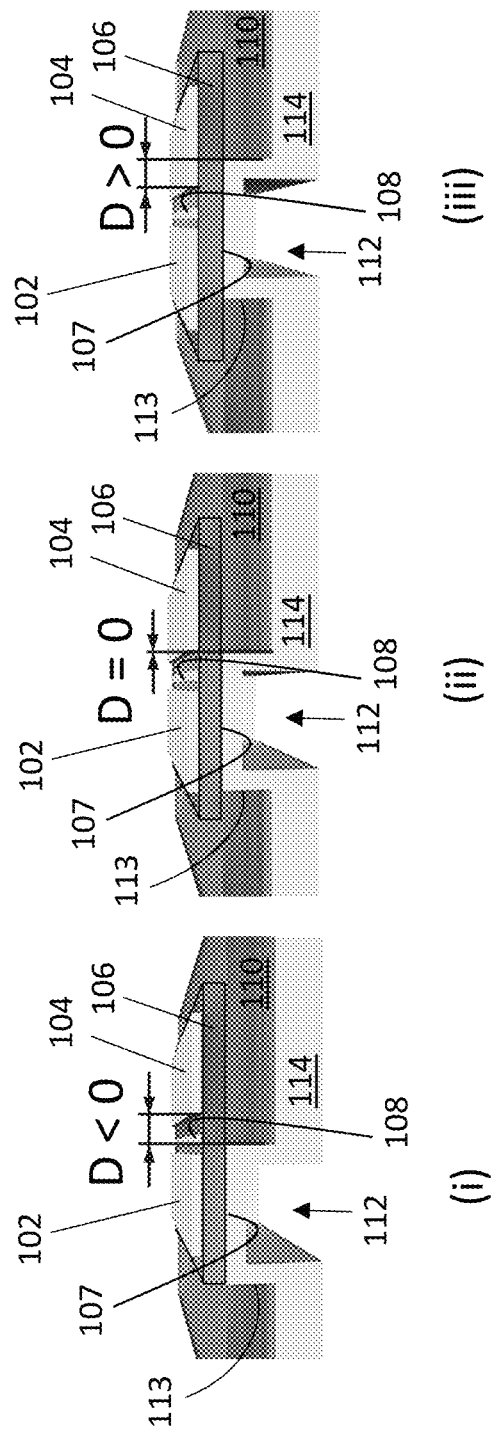
Figure 4H:
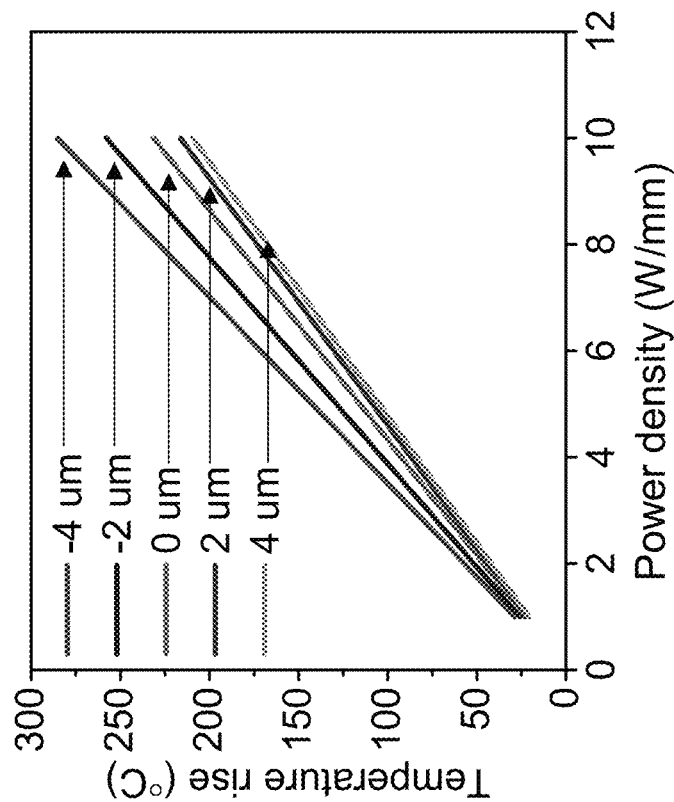

The via underlying the active region in the transistor is dimensioned and positioned to provide improved thermal management, while keeping the parasitic capacitance at the drain low enough that is does not interfere with transistor operation. The greater the thermal contact area between thermally conductive film 114 and semiconductor structure 106, the more rapidly heat can be dissipated from the active region of the transistor. However, if the dimensions of the via and the thermally conductive film coating its interior surfaces are not carefully controlled, parasitic capacitance can develop, which can limit the transistor's cutoff frequency and maximum oscillator frequency. Parasitic capacitance at a grounded source electrode is not a significant concern; and although a slightly increased parasitic capacitance at the gate due to an overlap between the gate electrode and the via may degrade the transistors' performance, this effect is alleviated by the enhanced heat dissipation. In contrast, an overlap between the drain electrode and the via has a very limited effect on improving heat dissipation but leads to a large extra parasitic capacitance at the drain, which can significantly degrade transistor performance and require extra measures to reduce its effect during a circuits design process (i.e., a more complex circuit design with compromised performance would be the likely result). For this reason, the polymer substrate to which the semiconductor structure is mounted should be largely retained beneath the transistor's drain electrode. This is illustrated in FIG. 2B, which shows a flexible microwave transistor that includes two gates in a common source (S) configuration with a single drain (D). The parasitic gate-source capacitance ($C_{gsL1}$, $C_{gsL2}$, $C_{gsV1}$, and $C_{gsV2}$) the parasitic drain capacitance ($C_{dL1}$, $C_{gdL2}$, $C_{gdV1}$, and $C_{gdL1}$), and the drain-source capacitance ($C_{dsL1}$, $C_{dsL2}$, $C_{dsV1}$, and $C_{dsV2}$)) are shown. For comparison, a flexible transistor mounted directly onto a planar metal (e.g., Cu) film is shown in FIG. 2A. Because the polymer substrate provides a dielectric layer between the drain electrode (D) and the bottom ground plane, there is a lower parasitic capacitance associated with the drain in the HEMT of FIG. 2B, relative to the parasitic capacitance associated with the drain in the HEMT of FIG. 2A. Notably, however, it is possible for the via and the thermally conductive film contained therein to extend partially below the drain electrode to achieve increased thermal management, without unduly sacrificing device performance, as demonstrated in the Example. Thus, in various embodiments of the transistors, the via extends: (a) only below the source electrode and the portion of the channel extending from the source electrode up to the gate electrode (FIG. 4A, panel (i), D<0)); (b) only below the source electrode, the portion of the channel extending from the source electrode up to the gate, and at least a portion of the gate electrode itself; (c) only below the source electrode, the portion of the channel extending from the source electrode up to the gate, the gate, and at least a portion of the channel extending from the gate electrode up to the drain electrode (FIG. 4A, panel (ii)), D=0); or (d) below the source electrode, the gate, the channel extending from the source electrode to the drain electrode, and a portion of the drain electrode itself (FIG. 4A, panel (iii), D>0). As the thermally conductive film is extended further below the drain electrode, there comes a point at which the operating temperature no longer continues to fall (i.e., the thermal management provided by the film saturates). Therefore, there is no thermal benefit to further extending the via, but a cost arises in the form of an increased parasitic capacitance. In the flexible transistor design described herein, these two considerations can be balanced to enable high operating frequencies. The maximum lateral distance by which the via should underlie the drain electrode will vary depending upon the amount of dissipated power. Generally, however, the via will extend under the drain electrode by no more than about 2 μm, and preferably no more than about 1 μm, as measured from the front edge of the drain electrode, to keep parasitic capacitance as low as possible.

Notably, although the discussion above and the Example that follows focus on transistors having a common source configuration in which the source electrode is grounded, the thermal management approach described herein can also be applied to transistors having a common gate design in which the gate electrode is grounded. In these embodiments, the via underlying the active region in the transistor is dimensioned and positioned to provide improved thermal management, while keeping the parasitic capacitance at both the source and the drain low enough that is does not interfere with transistor operation. Thus, the via should be sized and positioned so that it underlies the portion of the channel that extends between the source electrode and the gate electrode and may, optionally, further extend under the gate electrode itself and the portion of the channel that extends from the gate electrode to the drain electrode. And, while the via may still further extend under at least a portion of source electrode and/or under a portion of the drain electrode, the extent to which it does so should be limited in order to reduce, minimize, or avoid parasitic capacitance associated with the source and/or the drain. By way of illustration, in common gate transistors in which the via underlies a portion of the source electrode and/or drain electrode, the maximum lateral distance by which the via should underlie the source electrode and/or the drain electrode should be no more than about 2 μm, and preferably no more than about 1 μm, as measured from the front edge of the source electrode or the drain electrode.

One or more of the flexible, high-frequency transistors described herein can be incorporated into an integrated circuit comprising other transistors, active and passive components, and interconnects for use in flexible microwave electronics. Such circuits, which include amplifiers and oscillators, are designed to operate at frequencies from hundreds of MHz to tens (10+) and even hundreds (100+) of GHz. For example, a flexible transistor of the type described herein can be integrated with one or more capacitors and/or inductors and/or transmission lines to form a microwave amplifier. One such amplifier is demonstrated in the Example below.

The thermal management approached described herein can also be applied to HBTs. One example of a method for fabricating an HBT is shown schematically in FIG. 12. The process begins an HBT 1200 that been encapsulated with in a dielectric polymer 1204 (panel (a)). Encapsulation can be carried out by transfer printing a pre-fabricated HBT onto a sacrificial support substrate 1202 the surface of which is coated with the dielectric polymer. HBT 1200 can then be transfer printed onto the dielectric polymer coating and an additional layer of the dielectric polymer can then be applied over HBT 1200 to encapsulate it. HBT 1200 includes a mesa stack comprising a base 1210 disposed between a collector 1208 and an emitter 1212. Optionally, a sub-collector 1206 is included below collector 1206 to provide good ohmic contact with a collector contact 1214. Emitter contact 1220 is provided in electrical communication with emitter 1212 and base contact 1216 is provided in electrical communication with base 1216, where electrical communication can be provided by placing the components in direct contact or in contact through one or more electrically conductive layers. Electrical interconnects 1222 and 1224 (panel (b)) and contact pads 1226 and 1228 are than integrated into polymer dielectric to allow the HBT to be integrated into an electronic circuit 1230 (panel (c)). HBT 1200 and the circuit 1230 into which it is integrated can then be encapsulated by applying additional dielectric polymer 1204 over circuit 1230 (panel (d)).

Efficient heat dissipation is provided by defining a via in dielectric polymer 1204 over emitter contact 1220. The sidewalls of the via extend from the upper surface 1238 of dielectric polymer encapsulation layer 1204 to the upper surface of emitter contact 1220, such that a portion of the surface of emitter contact 1220 is exposed through the via. The via is then filled with a thermally conductive material to form a thermally conductive material-filled via 1232 (panel (e)) and a layer of the thermally conducting material 1234 on upper surface 1238 of polymer dielectric layer 1204. Although the via above the emitter is completely filled with the thermally conductive material in FIG. 12, the thermally conductive material can also take the form of a conformal film of the thermally conductive material on the sidewalls of the via and the exposed surface of emitter contact 1220. The thermally conductive material filled (or thermally conductive material coated) via is sized and positioned so that it overlies and provides heat dissipation from emitter.

The width of the filled/coated via 1232 is desirably as wide as, or only slightly narrower than, the width of emitter 1210 in order to maximize heat dissipation. For example, the width of filled/coated via 1232 may be in the range from 70% to 100% of the width of emitter 1210. The use a wide via is advantageous because it facilitates the filling or the coating of the inside of the via with the thermally conductive material. Finally, additional vias 1236 can be opened in dielectric polymer encapsulation 1204 is order to provide external access to circuit 1230 (panel (f)).

Base 1210, emitter 1212, collector 1208, and subcollector 1206 can be made from a variety of semiconductor materials, including Group IV and Group III-V semiconductors. Examples of suitable semiconductors and a description of methods for transfer printing HBTs can be found in U.S. Pat. Nos. 10,497,817 and 8,866,154. The polymer dielectrics and thermally conductive materials for the HBTs may be the same materials used for the field effect type transistors described herein.

Terms denoting relative positions, such as "top," "bottom," "over," "under," "below," "beneath," "upper," and "lower," and the like in the description and in the claims are not intended to indicate that the structures and devices recited herein are fixed in a permanent orientation. Instead these terms describe the relative positions of the components of the transistors when the field effect transistors happen to be oriented polymer substrate-side-down and gate-side-up as viewed by the user or the HBTs happen to be oriented emitter-side-up and collector-side-down as viewed by the user.

Example

This example demonstrates a flexible microwave amplifier suitable for circuit-level integration. The flexible integrated microwave amplifier exhibits the highest output power over 25 mW and the highest power-added efficiency (PAE) over 13.5% with input RF signal at 5 GHz, which is, to the inventors' knowledge, the highest performance of a flexible integrated RF power amplifier.

Figure 1D:
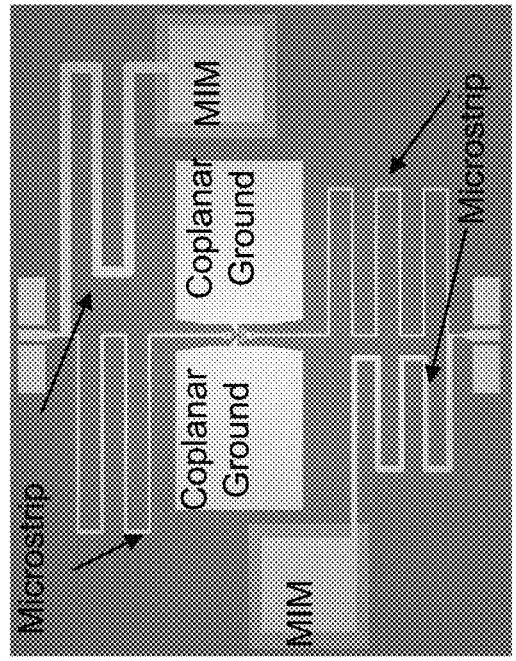
Figure 1C:
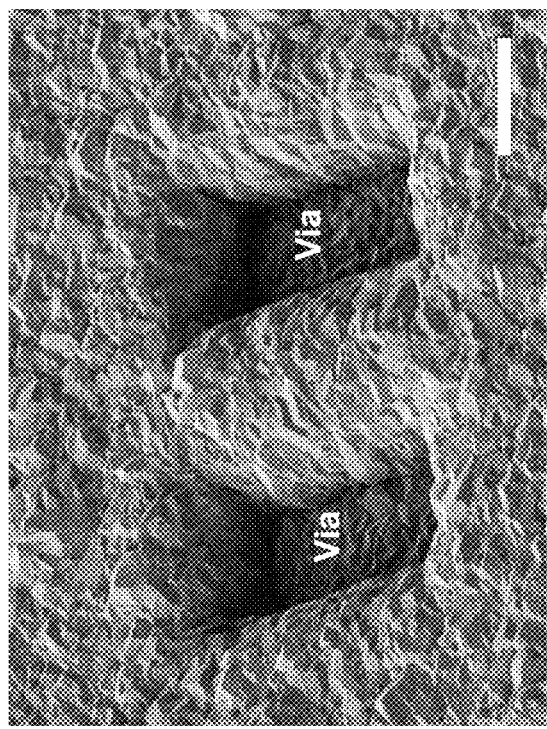

As shown in FIG. 1B, the flexible microwave transistors were fabricated by etching TSVs in a thin-film polyimide substrate under source electrodes (connecting to ground in circuits) and the channel region of the membrane GaN HEMT from the bottom surface of the PI film. The TSVs were subsequently coated with thick copper by electroplating (FIG. 1C). Since copper (k=380 W·cm/° C.) has higher thermal conductivity than GaN, heat generated in the channel region of the GaN HEMT can be effectively spread in the coated copper film (FIG. 1B). Accordingly, the flexible GaN HEMT can use smaller high-cost epitaxial GaN films than in the conventional approach, which is critical to reduce the cost of flexible microwave electronics. In contrast, the more limited heat dissipation mechanisms for a conventional flexible GaN HEMT are shown in FIG. 1A.

Since there is a thick dielectric layer between the drain electrode and bottom ground plane (FIG. 2B), the transistor design described herein leads to lower parasitic capacitance associated with the drain electrode in the HEMT than the parasitic capacitance in the flexible HEMT on a copper film with a metal adhesive layer (FIG. 2A). Based on this transistor design, an integrated flexible microwave amplifier integrating a flexible GaN HEMT with thin-film microstrip transmission lines and large-area metal-insulator-metal (MIM) capacitors was designed and fabricated (FIG. 1D).

Thermal Dissipation of Flexible GaN HEMT.

Figures 3A, 3B:
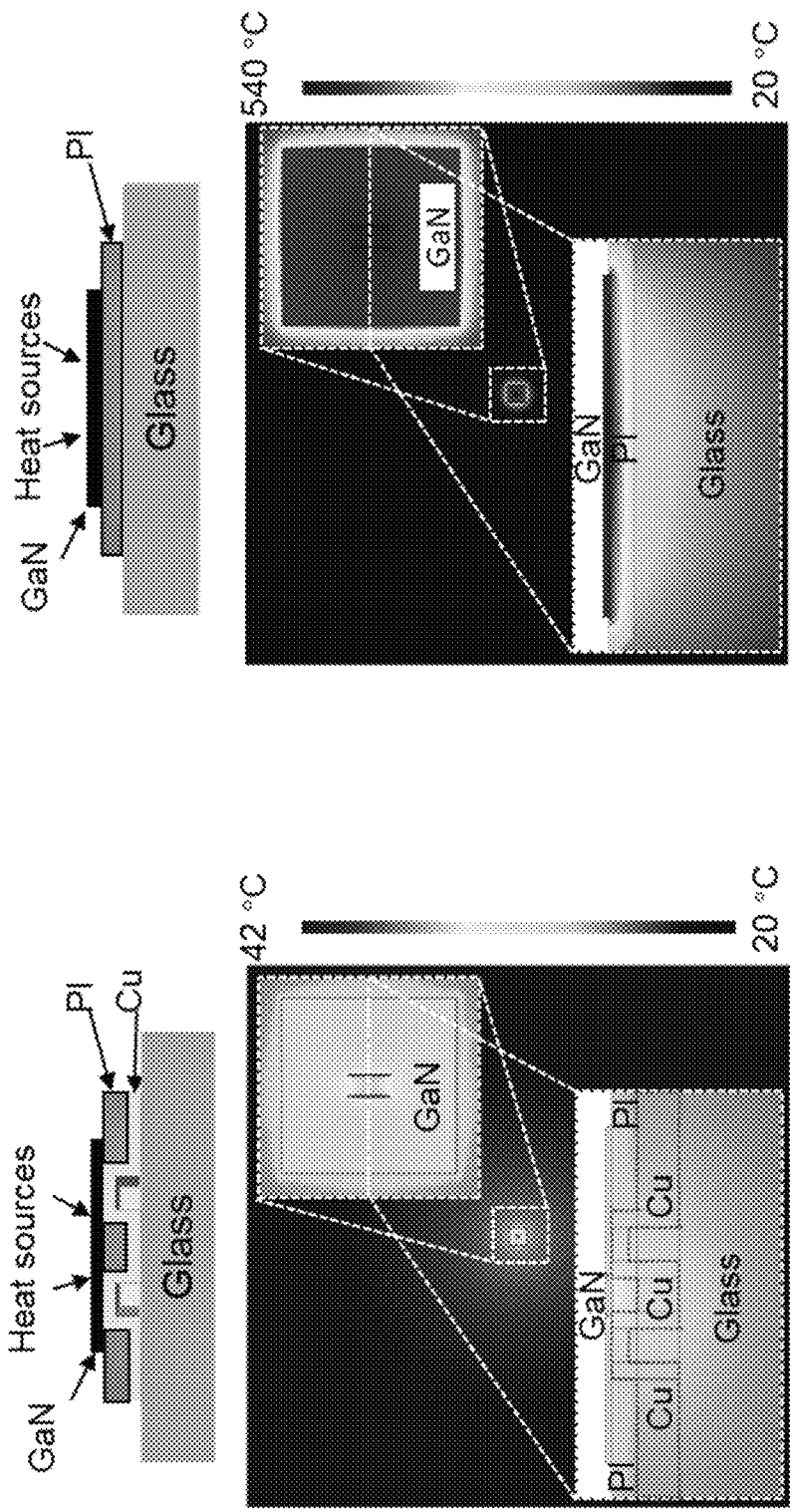
FIGS. 3A-3D show thermal characterization of a flexible GaN HEMT.

Finite element analysis (FEA) (COMSOL Multiphysics) was first performed to study heat dissipation of the flexible GaN HEMT manufactured by the new approach proposed herein (FIG. 3A) and a conventional approach (FIG. 3B). The flexible GaN HEMT was modelled as a GaN film with a size of 200 μm×200 μm, and two GaN strips with lengths of 50 μm and widths of 0.5 μm were used as heat sources in the FEA study. When the distance between gate-side edges of via holes and heat sources (D, as defined in FIG. 4A) was 2 μm, the membrane HEMT on engineered PI substrate showed channel temperature as low as 41.8° C. with dissipated power of 0.1 W (power density of 1 W/mm) (FIG. 3A). The low channel temperature is essential for achieving reliable high-performance operation of the flexible GaN HEMT. In contrast to a flexible HEMT with improved thermal management, the conventional flexible GaN HEMT on PI substrate without TSVs showed channel temperature of 522° C. in the FEA study with D of 2 μm and dissipated power of 0.1 W (FIG. 3B), which will cause failure of the HEMT before reaching such high temperature.

Figure 4G:
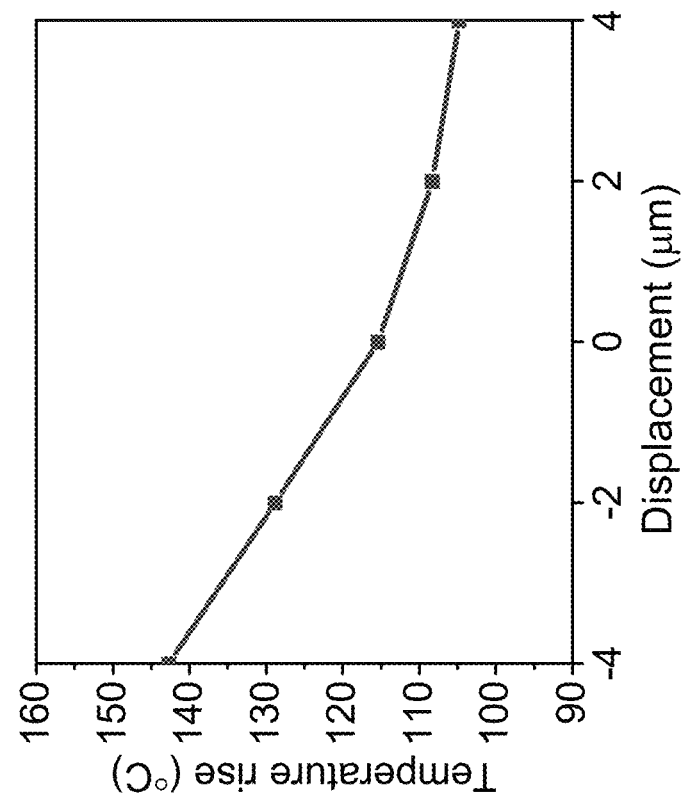

The influence of D on heat dissipation of the proposed structure was studied by varying D from −4 μm to 4 μm with dissipation power of 0.5 W in FEA simulation (FIGS. 4B-4F). When D increased, the overlapping area between the heat sources and the copper coated TSVs increased, and the channel temperature decreased accordingly (FIG. 4G). When D was larger than 2 μm, the copper coated TSVs overlapped the drain electrodes, and the channel temperature showed an obvious saturating trend. Meanwhile, the drain electrodes and the bottom ground plane at the overlap region formed parallel plate capacitors, which had large parasitic capacitance due to the thin thickness of the insulating GaN layer (~3.5 μm). Since the large parasitic capacitance acts as a short path for a high frequency signal beyond the GHz range, the design process of flexible microwave circuits requires excessive efforts if a flexible HEMT with a large overlap region between the drain electrodes and the bottom ground plane is used. To reach a balance between the enhanced heat dissipation and adverse effect from parasitic capacitance, D should have an appropriate value around 2 μm.

Further FEA simulation was performed to study the power handling capability of the structures in FIGS. 4B-4F. The channel temperatures of the flexible HEMTs linearly increased as the dissipated power in heat sources increased. When the temperature rise was 180° C., corresponding to a widely used testing channel temperature of 200° C. to evaluate mean time to failure (MTTF) of microwave GaN HEMTs, the flexible GaN HEMT could handle dissipated power around 8.6 W/mm and 8.3 W/mm with D of 4 μm and 2 μm, respectively. Thus, the flexible GaN HEMT can safely operate at least with dissipation power of 8 W/mm due to GaN HEMT's excellent thermal reliability.

Figure 3D:
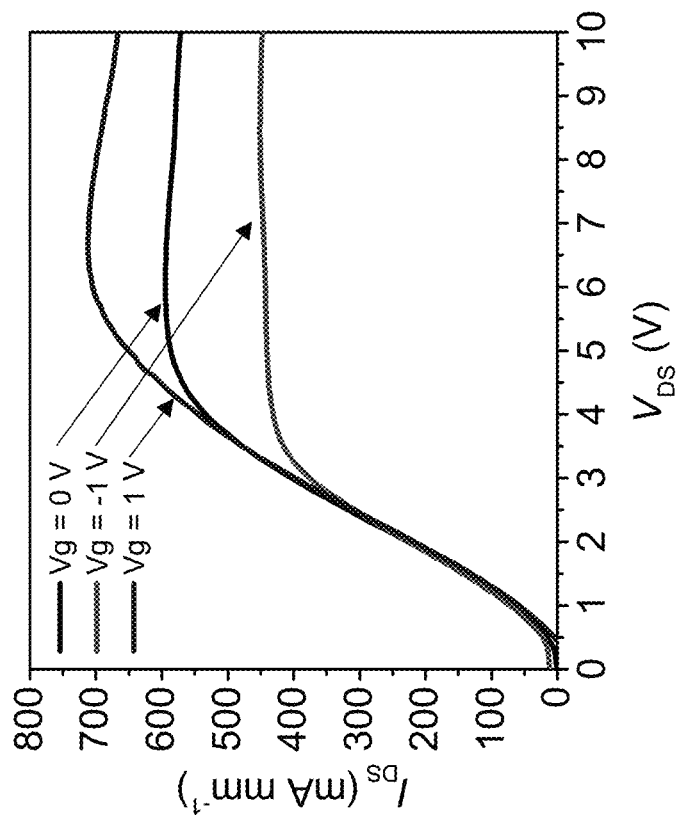
Figure 5A:
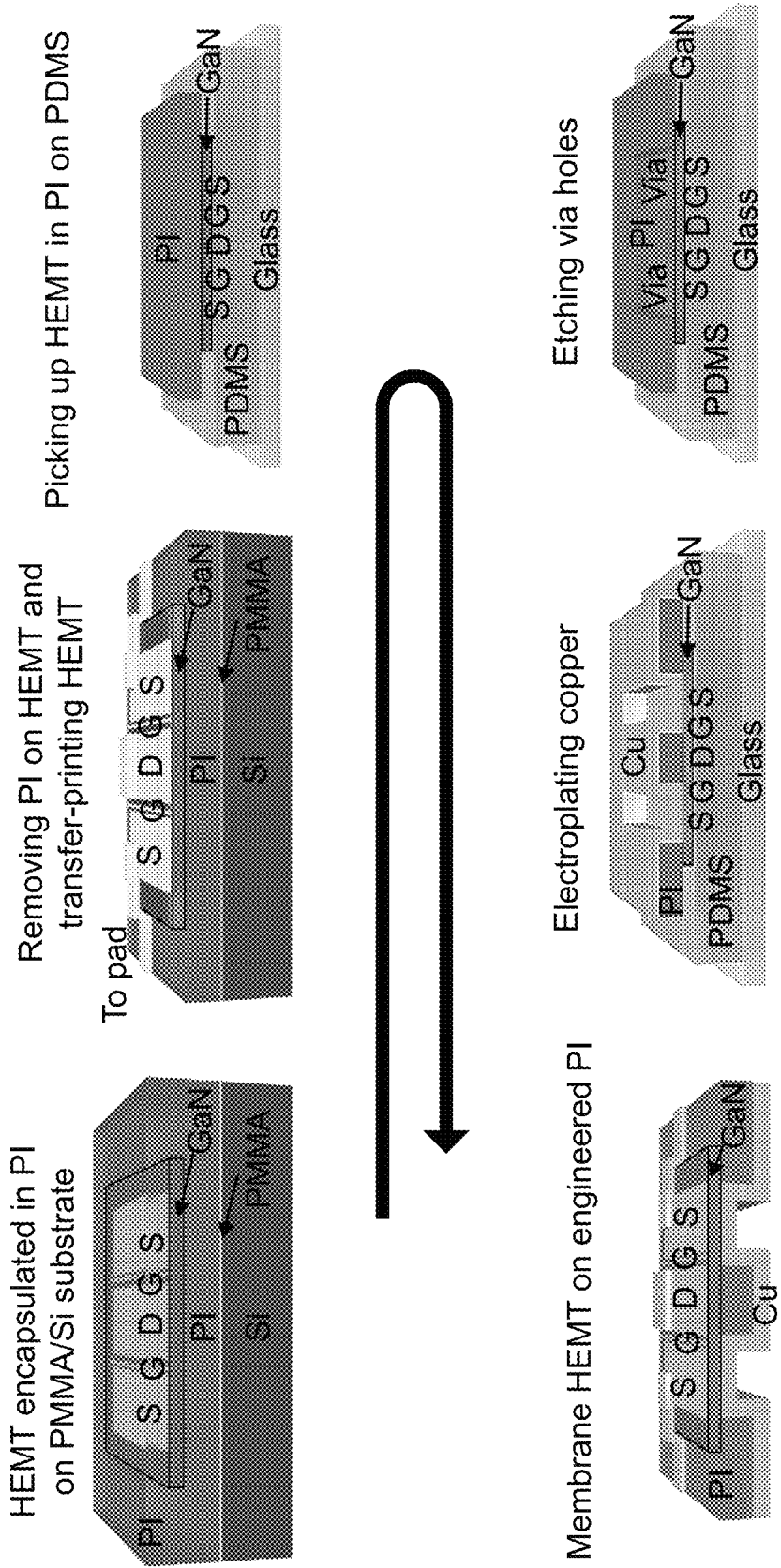
FIGS. 5A-5B show schematic fabrication process flows of flexible GaN HEMTs for thermal characterization.
Figure 5B:
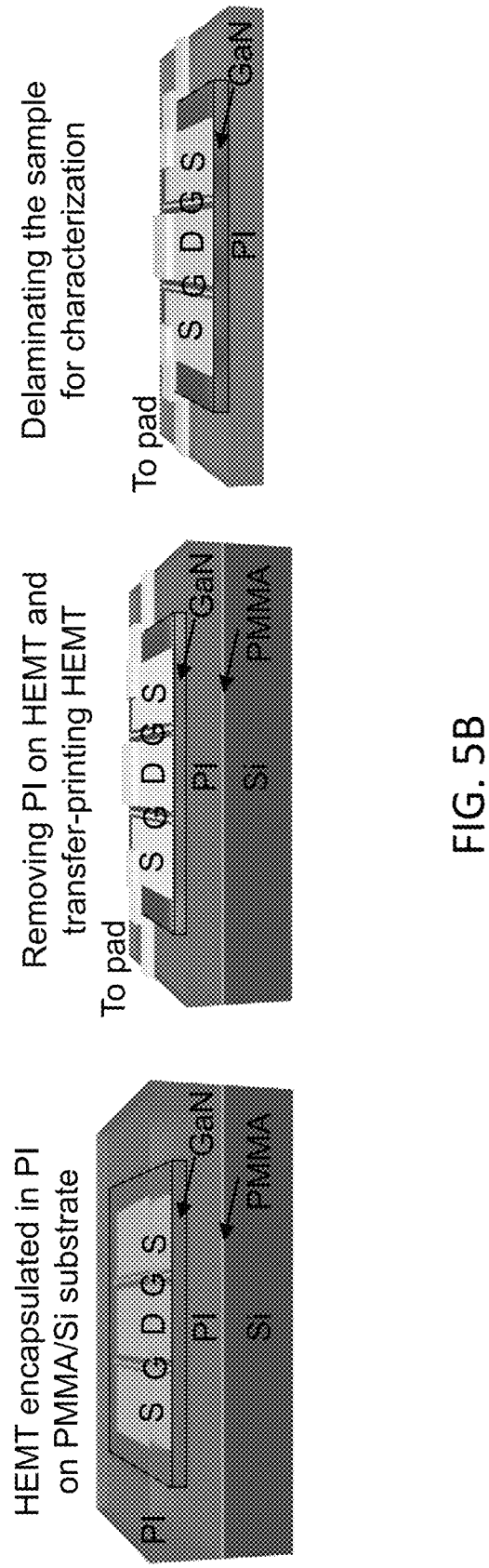

To further elucidate the heat dissipation capability of the flexible microwave transistor, flexible GaN HEMTs were manufactured on the PI substrate and conventional PI substrate, and heat dissipation in them was studied by characterizing DC performance (See details of fabrication in FIGS. 5A-5B). A ~25 μm copper layer was electroplated on a flat surface, and the copper layer on the sidewalls of TSV was estimated to be ~10 μm. Due to inefficient heat dissipation, the HEMT on conventional substrate showed a stronger self-heating effect during DC characterization, which led to much lower drain current and larger negative differential resistance of the flexible HEMT on conventional PI substrate than the one on engineered PI substrate (gate bias voltage is −1 V). Since the output RF power of the microwave transistor is proportional to the transistors' maximum drain currents, the flexible GaN HEMT on engineered PI substrate can output much higher RF power than its counterpart on conventional PI substrate. When the gate bias voltage increased to 1 V, the flexible GaN HEMT on the proposed PI substrate exhibited drain current density of 667 mA/mm at drain bias voltage of 10 V, corresponding to dissipated power of 0.334 W (3.34 W/mm) during DC characterization (FIG. 3D). It is worth noting that the size of the flexible GaN HEMTs characterized here was only 200 μm×200 μm, which indicates that the flexible GaN HEMT achieved a record-high dissipated power/area ratio of 16.7 W/mm². The flexible HEMT on engineered PI substrate had no observable change after DC characterization. In contrast, despite its low drain current at DC characterization, the flexible HEMT on conventional PI substrate burned during DC characterization due to excessive heating in the channel region. Thus, the transistor design described herein can effectively promote heat dissipation of flexible GaN HEMTs and leads to substantially lower channel temperature in the transistors than conventional manufacturing methods.

RF Characteristics and Mechanical Stability of Flexible HEMT.

Figure 2C:
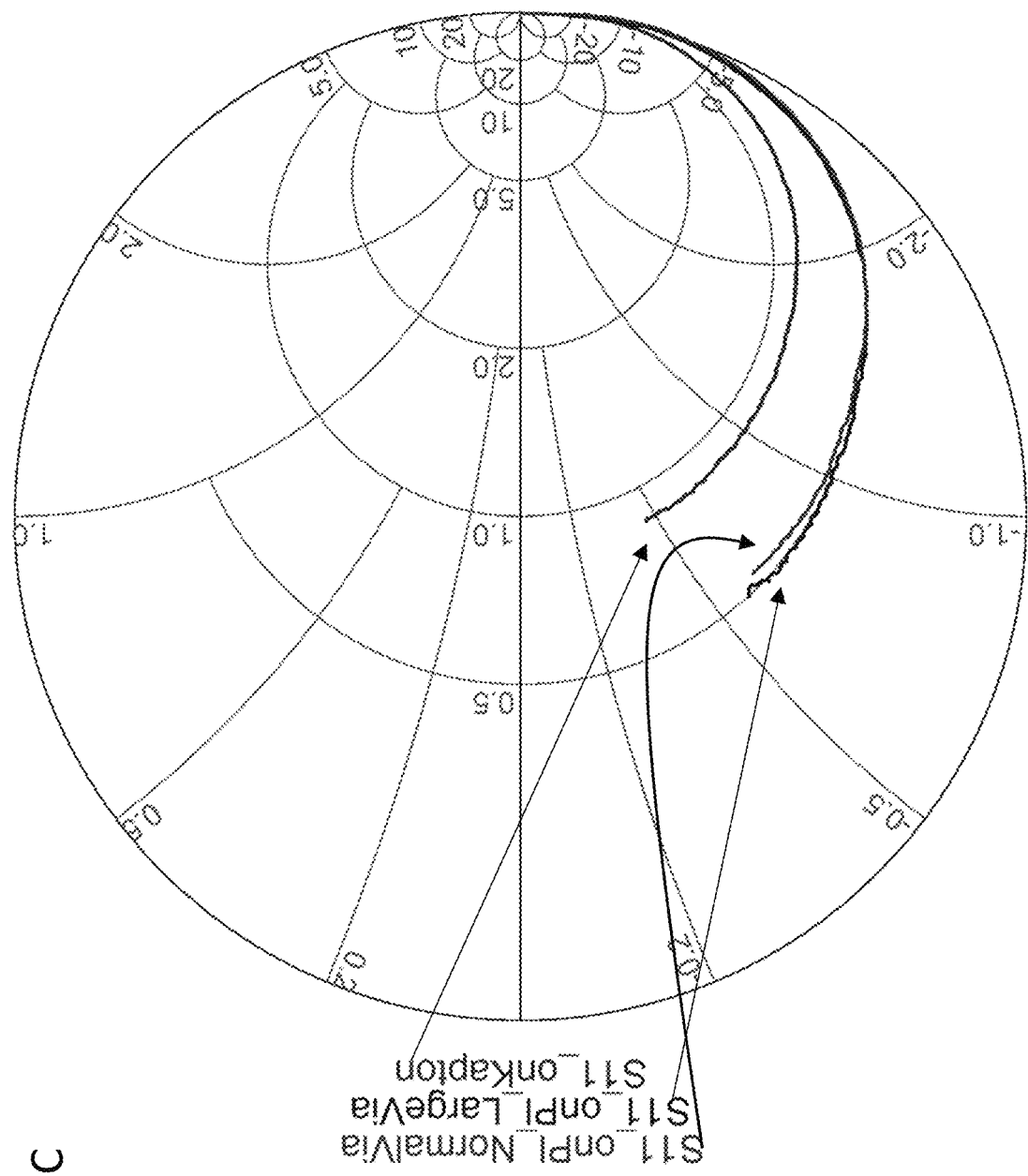
FIGS. 2C-2F show $S_{11}$ $S_{21}$ and $S_{22}$, respectively, of the flexible GaN HEMTs on engineered PI substrate with normal size TSV overlapping source electrodes and channel region, with large TSV overlapping entire active region, and on 127 μm Kapton film.
Figure 2D:
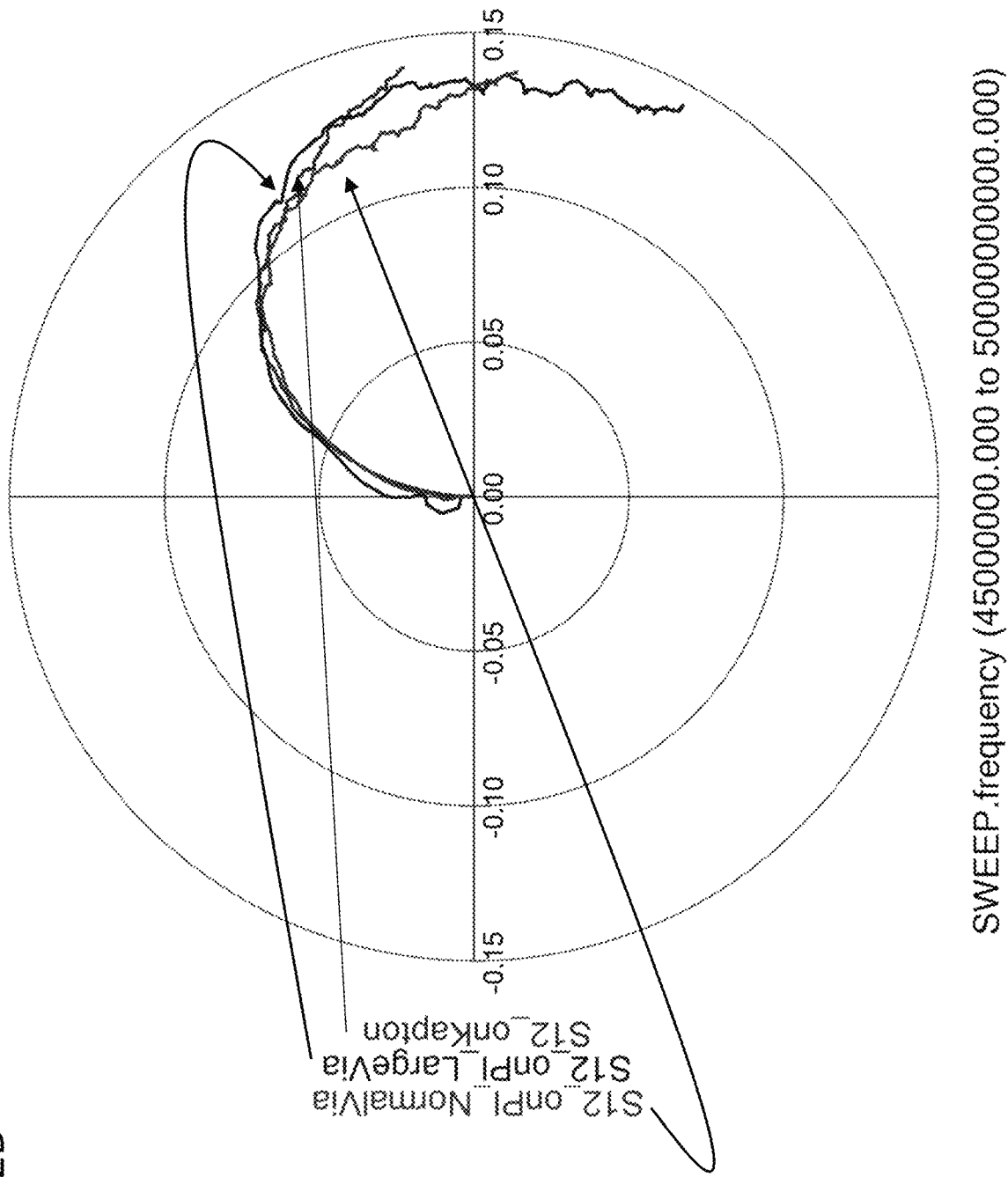
Figure 2E:
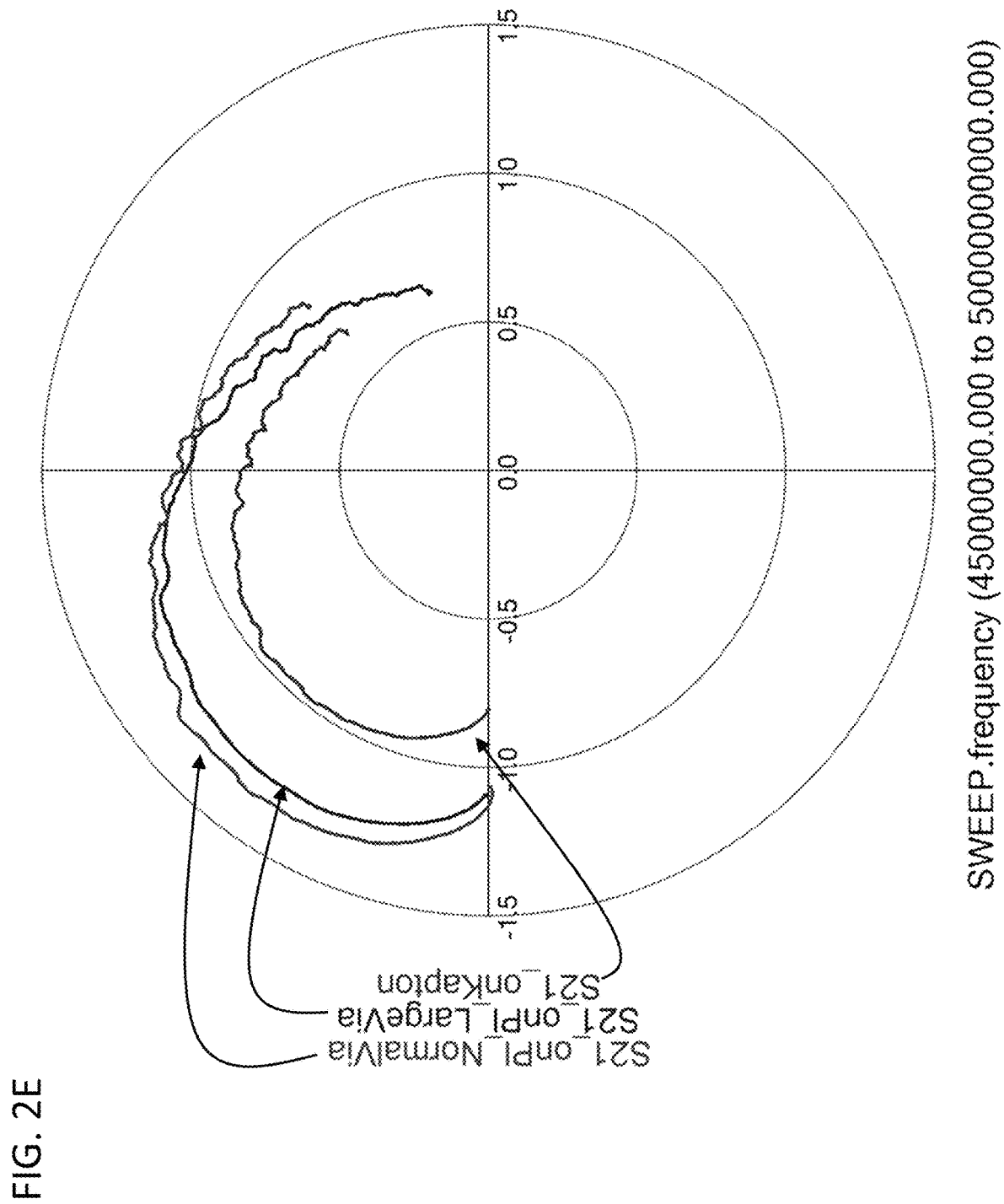
Figure 2F:
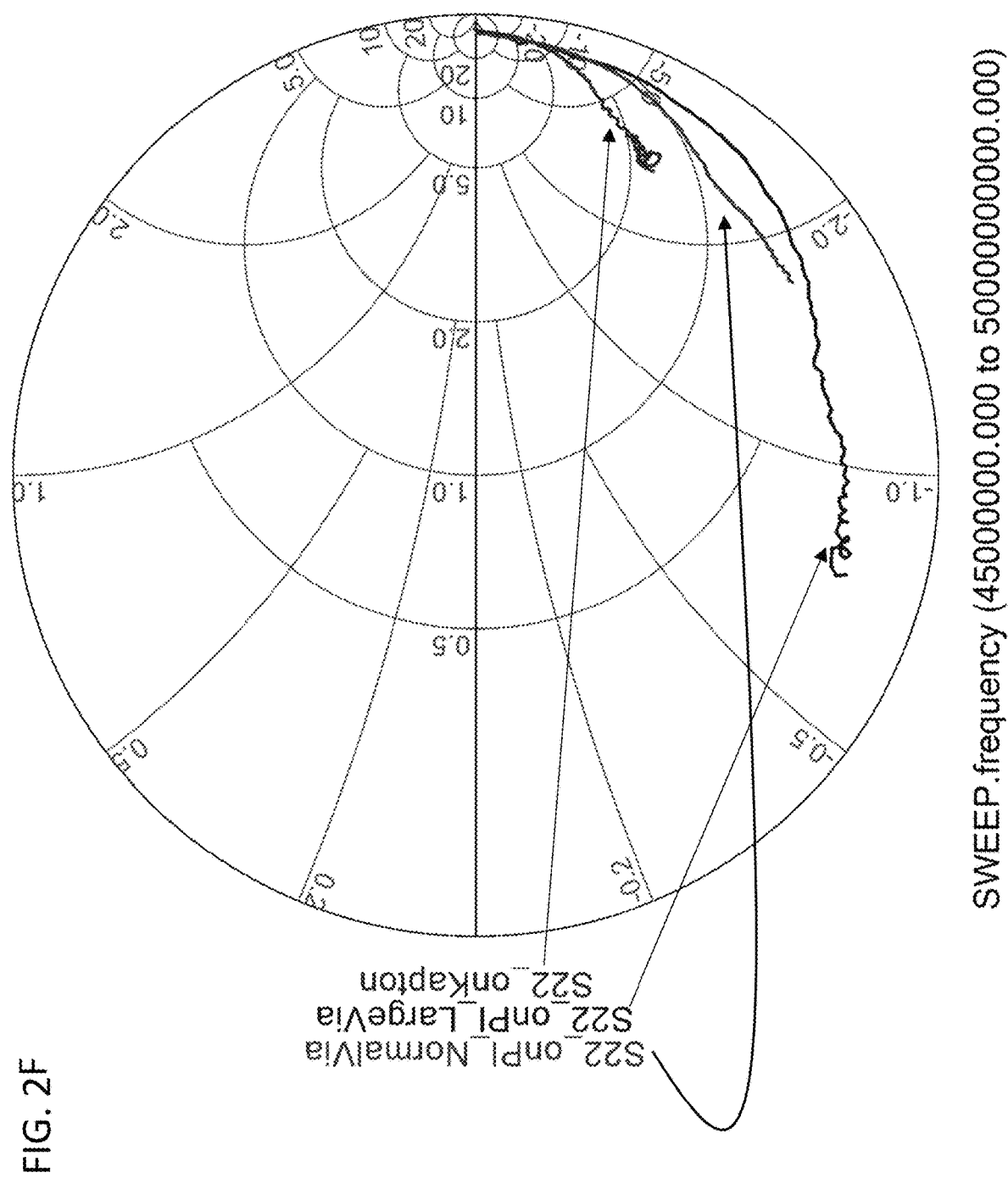

To realize high performance, flexible microwave systems require high-performance flexible microwave transistors. Here, two flexible GaN HEMTs were fabricated and characterized with ground-signal-ground (GSG) pads on the PI substrate with normal size TSVs (FIGS. 6A-6B) and large size TSVs (FIG. 7), and a flexible GaN HEMT was fabricated on ~127 μm Kapton film to study the influence of the transistor design described herein on RF performance of the flexible GaN HEMT. Since the distance between the gate electrodes and the bottom ground plane of the flexible GaN HEMT on Kapton film was substantially larger (~130 μm, including Kapton film and membrane GaN) than the distance in the flexible GaN HEMTs on the PI substrates (~3.5 μm, membrane GaN), the HEMT on Kapton film had a much lower parasitic gate capacitance ($C_{gsL1}$, $C_{gsL2}$, $C_{gsV1}$, and $C_{gsV2}$ in FIGS. 2A-2B) than the HEMTs on the PI substrates and an accordingly different $S_{11}$ curve. Similarly, $S_{22}$ curves showed great difference for the three flexible GaN HEMTs characterized here. The S-parameter curves are shown in FIGS. 2C-2D. It's worth noting that the flexible GaN HEMTs on the PI substrates showed obviously different $S_{22}$ when TSVs in the PI substrates had different size. The difference of $S_{22}$ was due to an extra overlap region between the drain electrodes and the bottom ground plane when the TSVs were large. The HEMT on Kapton film had the lowest $S_{21}$, which was due to the most significant self-heating effect caused by poor heat dissipation of thick low thermal conductivity Kapton film. Based on the measured S-parameters, maximum stable gain/maximum available gain (MSG/MAG), unilateral gain (U), and current gain ($H_{21}$) curves of the flexible GaN HEMTs (FIGS. 6C-6E) and corresponding $f_T$ and $f_{max}$ (Table 1) were extracted. The flexible GaN HEMT on engineered PI substrate with normal size TSVs showed the highest $f_T$ (33.8 GHz) and $f_{max}$ (69.8 GHz). When large TSVs were used, due to increased parasitic capacitance from increased overlap regions, the $f_T$ and $f_{max}$ decreased by ~9.5% and ~18.3%, respectively. Despite the slight decrease of parasitic capacitance, the flexible GaN HEMT on Kapton film showed larger degradation in $f_T$ (~12.4%) and $f_{max}$ (21.8%) since heat dissipation of flexible GaN HEMT was significantly limited by low thermal conductivity Kapton film. The parasitic capacitance associated with the transistor design described herein was further studied through electro-magnetic (EM) simulation of the metal pads in GaN HEMT on three different substrates.

The effect of parasitic capacitance of flexible HEMTs was investigated using electromagnetic (EM) simulation as shown in FIGS. 8A-8I. Metal pads and electrodes of HEMT were simulated on engineered PI substrate with a thickness of ~15 μm and Kapton film with a thickness of ~127 μm with a schematic cross-section as shown in FIGS. 8B and 8C. The via holes of simulated structures were depicted in grey shapes in FIGS. 8D-8E. After simulating EM properties of the structures, parasitic capacitance was extracted using equivalent circuits in FIG. 8A, and they were plotted in FIGS. 8G-8I, respectively. Parasitic capacitance of HEMT on engineered PI substrate with large TSV was significantly larger than the HEMTs on other substrates.

TABLE 1

Summary of small-signal RF performance of the flexible GaN HEMT on various substrates under flat testing conditions.

|  | on PI (normal size TSV) | on 127 μm Kapton (no TSV) | on PI (large size TSV) |
|---|---|---|---|
| $f_T$ (GHz) | 33.8 | 29.6 | 30.6 |
| $f_{max}$ (GHz) | 69.8 | 54.6 | 57 |

The mechanical stability of the flexible GaN HEMT on proposed PI substrate was investigated by characterizing S-parameters of the flexible GaN HEMT under different mechanical bending conditions. Although the smallest bending radius was as small as 15.5 mm, the flexible GaN HEMT still maintained almost unchanged S-parameters compared to the measurement on flat metal stage. FIGS. 6F and 6G present gain curves (MSG/MAG, U, and $H_{21}$) of the flexible GaN HEMT laminated on bent metal surfaces with bending radius of 28.5 mm and 15.5 mm, respectively. FIG. 6H shows a comparison of MAG/MSG curves in FIG. 6C, FIG. 6F, and FIG. 6G. The flexible HEMT exhibited less than 0.3% deviation in cut-off frequency ($f_T$) and ~2% deviation in maximum oscillation frequency ($f_{MAX}$) when bending radius was 15.5 mm (Table 2). The excellent stability of the flexible GaN HEMT's RF performance was due to the reduced mechanical strain in the HEMT caused by the thin flexible substrate (~40 μm vs. 100~250 μm of typical flexible substrates), which is confirmed by Raman spectroscopy. Moreover, the characterization of the bent flexible GaN HEMT with bending radius of 15.5 mm shown here is, to the inventors' knowledge, the first demonstration of RF performance of flexible GaN HEMT with bending radius below 20 mm, which shows great flexibility of the flexible GaN HEMT.

TABLE 2

Summary of small-signal RF performance of the flexible GaN HEMT on engineered PI substrate with normal size TSV overlapping the source electrode and channel region under mechanical bending.

|  | Flat | R = 28.5 mm | R = 15.5 mm |
|---|---|---|---|
| $f_T$ (GHz) | 33.8 | 33.7 | 33.7 |
| $f_{max}$ (GHz) | 69.8 | 68.9 | 68.4 |

Circuit-Level Integration of the Proposed Approach.

Integrating the flexible microwave transistors at circuit level is critical for improving flexible microwave circuits/systems' performance and expanding the circuits' applications. A flexible microwave amplifier, i.e. the most important microwave circuits in a microwave front-end module, is demonstrated here, which incorporates a Cu-filled via to help dissipate heat in an active transistor. The flexible microwave amplifier includes a flexible thin-film GaN HEMT as the active transistor and passive circuits based on microstrip transmission lines on engineered PI substrate. The flexible microwave amplifier can operate at 5 GHz with over 25 mW output power.

Here, a microstrip transmission line was used as a building block of impedance matching networks due to its structure and superior performance at GHz range. The microstrip transmission line exhibited insertion loss ($S_{21}$) as low as ~1 dB/mm up to 50 GHz and $S_{11}$ below –20 dB under various testing conditions. A negligible variation in characteristic impedance of the transmission line under mechanical bending suggests excellent mechanical stability of the transmission line, which is critical to achieve mechanically stable flexible microwave circuits. Two large-area MIM capacitors were used to short RF signals at the end of the parallel stub in the impedance matching networks. Dimensions of microstrip transmission lines and MIM capacitors were carefully designed and optimized through EM simulation (ADS Momentum, Keysight). The microstrip transmission lines were implemented in a meandered shape to minimize the amplifier's footprint (FIG. 1D). EM simulation shows the flexible microwave amplifier can obtain small-signal gain ($S_{21}$) of 11.2 dB and input and output reflection below –7.8 dB and –6.8 dB at 5 GHz. FIG. 9A highlights the major fabrication steps of the flexible microwave amplifier. The source electrodes of the HEMT, bottom electrodes of the MIM capacitors, and ground pads of the G-S-G probing pads were connected to the bottom ground plane through copper coated TSVs to minimize parasitic inductance caused by grounding.

Characterization of Flexible Amplifier.

Small-signal characterization was performed on the flexible microwave amplifier under different testing conditions with a drain bias voltage of 10 V and a gate bias voltage of –2.2 V for the highest small-signal gains (FIGS. 9B-9E). When the flexible microwave amplifier was tested on a flat metal stage, it showed small-signal gain of 10.2 dB at 5 GHz with input reflection loss (Sit) of –29.3 dB and output reflection loss ($S_{22}$) of –8 dB. The small-signal RF performance of the flexible microwave amplifier under mechanical bending showed almost negligible variation, which was due to the superior mechanical stability of the thin-film HEMT and the microstrip transmission line on the PI substrates. The flexible amplifier maintained almost unchanged small-signal gain even on low thermal conductivity high frequency laminate (Rogers RT/duroid 6006, k of ~1 W·cm/° C.) due to excellent heat dissipation in the flexible microwave transistors.

Figure 3C:
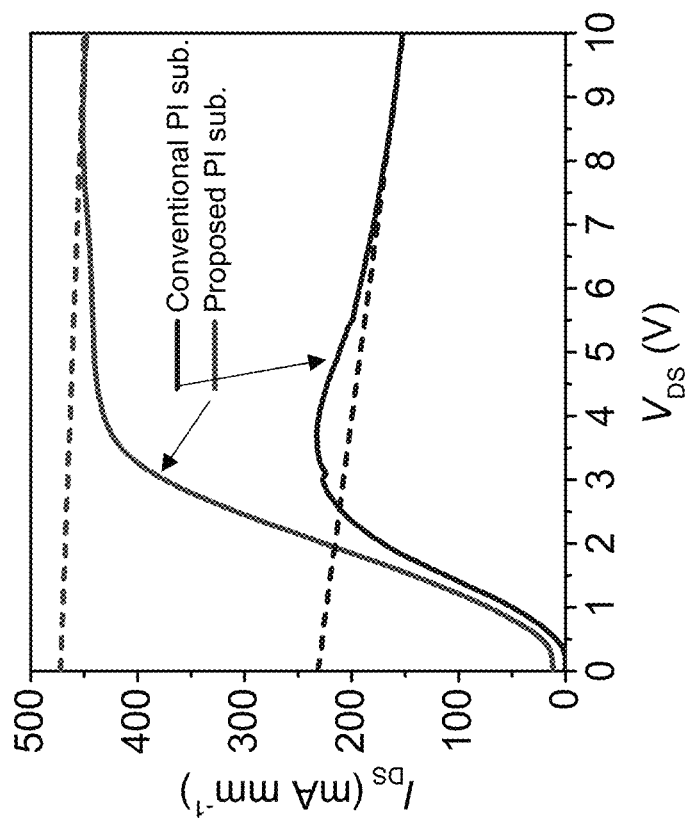
Figure 9F:
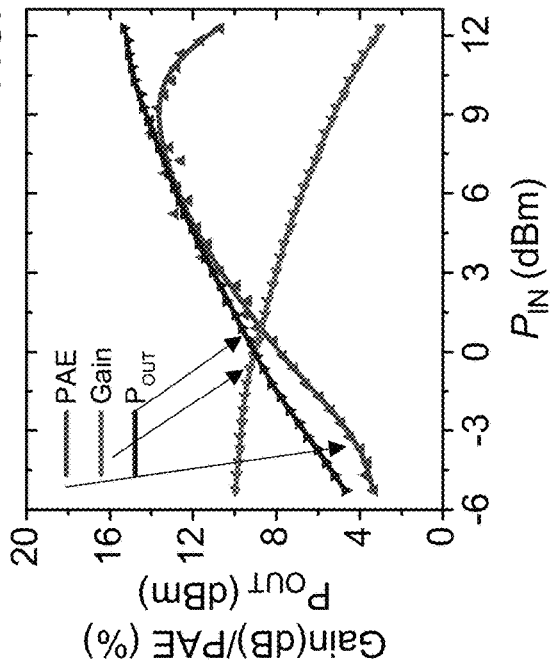
Figure 9G:
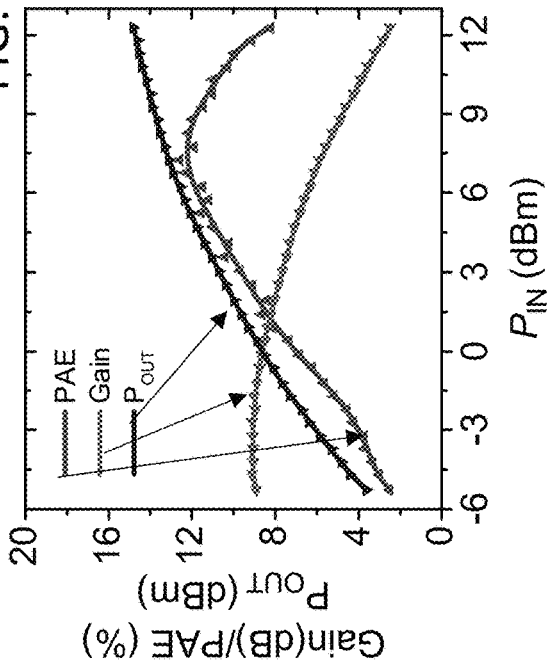
Figure 9H:
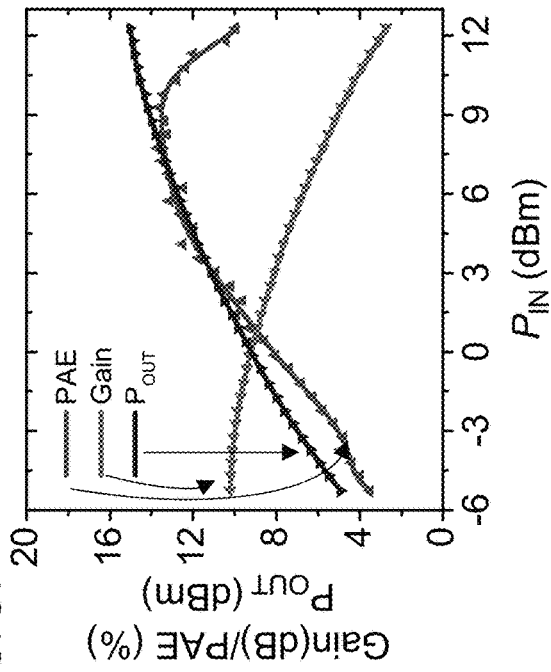
Figure 9I:
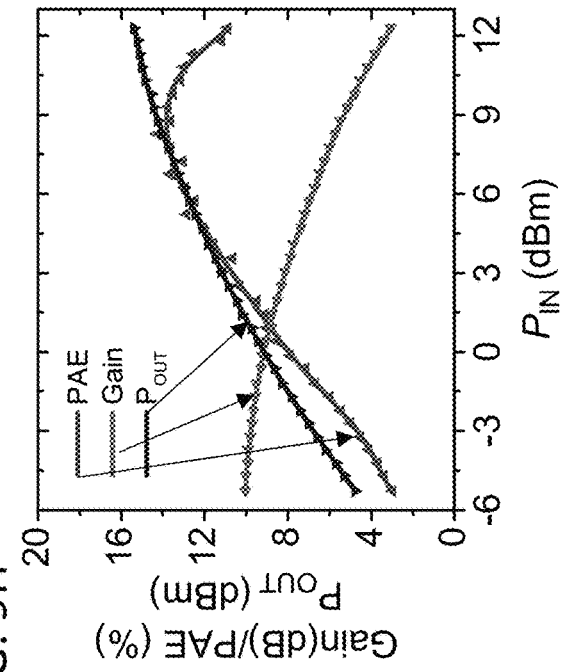

When signal strength of the input RF signal increased, the small-signal performance was unable to precisely characterize the RF power characteristics of the microwave amplifier. Here, the large-signal RF performance of the flexible microwave amplifier on proposed PI substrate was characterized using the measurement setup in FIG. 10 with 5 GHz RF input signal swept from –5.25 dBm (0.3 mW) to 12.3 dBm (17 mW) under the same bias conditions as small-signal characterization. The flexible amplifier exhibited power gain of 10.2 dB (10.5-fold) with input power of –5.25 dBm on a flat metal stage (FIG. 9F). At 1 dB compression point (gain of 8.3-fold), i.e. gain was 1 dB smaller than small-signal RF gain, the amplifier can output RF power 9.24 dBm (8.39 mW) with PAE of 8.19% (FIG. 9F). The flexible microwave amplifier can reach the highest PAE of 13.5% with gain of 5.15 dB (3.27-fold) and output RF power of 14 dBm (25.1 mW). This is, to the inventors' knowledge, the highest reported output power of a flexible integrated microwave amplifier at GHz range. The large-signal RF performance of the flexible microwave amplifier was further tested on bent metal stages. The large-signal RF performance of the flexible amplifier under mechanical bending had negligible changes from the measurement on flat metal stages. The flexible microwave amplifier showed peak PAE of 13.6% with output power of 14.3 dBm (26.9 mW) and gain of 5.22 dB (3.33 times) on the metal stage with R of 28.5 mm (FIG. 9G). When the bending radius decreased to as small as 15.5 mm, the highest PAE of the flexible microwave amplifier reached 13.8% with output power of 14.2 dBm (26.3 mW) and gain of 5.45 dB (3.51 times) as shown in FIG. 9H. This negligible variation is due to excellent mechanical stability of the flexible microwave amplifier as the invariant small-signal gain. Since large-signal RF characterization introduces much higher heat generated in the channel of the HEMT, the study of flexible microwave amplifier's large-signal performance on a low thermal conductivity substrate is highly required. Large-signal RF characterization was performed for the amplifier on the high frequency laminate used for small-signal characterization as well to study thermal stability of the flexible microwave amplifier during operation (FIG. 9I). Although the high frequency laminate has very low thermal conductivity of ~1 W·cm/° C., the peak PAE and corresponding output power of the amplifier tested on the frequency laminate just slightly decreased to 12.2% and 13.2 dBm (20.9 mW), respectively. Since the flexible amplifier operated at continuous wave mode during large-signal characterization, heat was continuously generated in the channel of GaN HEMT, which led to a slightly increased self-heating effect compared to small-signal characterization. As shown in FIG. 3C, the drain current of the GaN HEMT decreased slightly, and, accordingly, the flexible amplifier showed slightly degraded PAE and output power. The integrated flexible microwave amplifier showed the highest RF power performance among reported integrated flexible amplifiers operating beyond GHz range, especially considering the limited size GaN film used in the amplifier (365 μm×420 μm).

Methods

Fabrication of flexible GaN HEMT for thermal characterization: An AlGaN/GaN-on-Si wafer as shown in FIG. 11 was purchased from MSE Supply Inc. The 200 μm×200 μm flexible GaN HEMTs were fabricated as follows. The fabrication was started from defining the active region by dry etching ~100 nm AlGaN/GaN heterostructure using ICP-RIE. Source and drain electrodes were formed by electron-beam evaporation of Ti/Al/Mo/Au (15/60/35/55 nm) and lift-off process. The electrodes were annealed at 800° C. for 60 s using rapid thermal annealing to form ohmic contact. After gate patterning through electron-beam lithography, Schottky gate electrodes were formed by electron-beam evaporation of Ni/Au (15/150 nm) and lift-off process. The fabricated HEMTs were passivated using a $SiN_x/SiO_2$ (~100/100 nm) layer by PECVD at 250° C. Following etching via on electrodes, metal pads (Ti/Au/Al/Au=10/100/300/100 nm) were deposited using electron-beam evaporation for further characterization and electrical connection. A layer of $SiN_x$ (~100 nm) was deposited using PECVD to protect the HEMTs. After patterning isolation for HEMTs using photolithography, Cu/Ni (~250/750 nm) was sputtered to form a hard mask for isolation after lift-off process. The AlGaN/GaN heterostructure between HEMTs was fully etched using ICP-RIE. The Cu/Ni hard mask was removed using copper etchant (APS-100). The fabricated AlGaN/GaN HEMTs on Si was thinned down using mechanical polishing to around 200 μm. After polishing, a layer of thick photoresist (SPR220-7, ~7 μm) was spin-cast as a protection layer, and the sample was laminated on a microstructured PDMS stamp with the GaN side contacting the stamp. The Si substrate was fully etched using $XeF_2$ etching, and it was subsequently flip-transferred on a $2^{nd}$ microstructured PDMS stamp with denser, small PDMS pillars. After removing the photoresist protecting layer using acetone, an individual thin-film HEMT was picked up on a small PDMS stamp.

The incorporation of the heat-dissipating copper is illustrated schematically in FIGS. 5A-5B. The PI/PMMA/Si temporary substrate was prepared by spin-casting a layer of PMMA at 2500 rpm and 4 layers of PI at 2500 rpm and baking after each spin-casting. After curing the PI/PMMA/Si sample in nitrogen atmosphere, a layer of PI was spin-cast at 2500 rpm and baked at 100° C. for 30 s, and the thin-film HEMT was transfer printed on the sample using a modified mask aligner (Suss MJB3). A layer of PI was subsequently spin-cast to encapsulate the GaN HEMT on PI/PMMA/Si substrate. Via through the PI encapsulating layer and the $SiN_x$ protecting layer was etched on the HEMT using RIE to expose electrodes. Ti/Cu/Au (10/1400/100 nm) was patterned and deposited to form extended pads for characterization. The entire PI thin film was mechanically picked up on a PDMS stamp. Cu (150 nm) was patterned and deposited to form a hard mask to etch TSV in the PI thin-film. After etching TSV using RIE, the copper hard mask was removed using copper etchant (APS-100), and Ni/Cu (~10/100 nm) was sputtered as a seed layer for electroplating. A thick copper layer (~25 μm on surface, ~10 μm on sidewall) was electroplated using a home-made electroplating setup, which used an oversaturated $CuSO_4$ solution and copper film as an anode. Most of the area of the sample was covered using adhesive Kapton tape, and the exposed area (~1 cm×1 cm) was connected to a DC power source with voltage of 5 V. Ultrasonic agitation was applied during electroplating to form more uniform coverage on the sidewall of TSV. After electroplating, the sample was mechanically delaminated from a PDMS stamp for further characterization.

Fabrication of flexible GaN HEMT for RF characterization: The flexible GaN HEMTs for RF characterization were fabricated using modified fabrication process flow as the HEMT for thermal characterization. The fabrication process of RF AlGaN/GaN HEMTs on Si substrate starts from isolating AlGaN/GaN heterostructures. Ni (~700 nm) was patterned and deposited as a hard mask. After lift-off, the exposed AlGaN/GaN heterostructure was fully etched using ICP-RIE. The Ni hard mask was removed using piranha solution. AlGaN/GaN HEMT (~365 μm×420 μm) was subsequently fabricated on the AlGaN/GaN heterostructure using the same process as for HEMT described above. After thinning down the Si substrate using mechanical polishing, the array was diced to isolate HEMTs. One of the HEMTs was picked up and laminated on a PDMS stamp with the GaN side contacting the PDMS. The same Si etching process was used to remove Si substrate. The procedures used for fabrication of flexible HEMT for thermal characterization were applied to produce the flexible GaN HEMTs on engineered PI substrate. The flexible GaN HEMT on Kapton film was prepared using the same transfer-printing, via opening and deposition of RF pads procedures as described above.

Simulation of heat dissipation in flexible GaN HEMT on various substrates: FEA study was conducted using CMOSOL Multiphysics. Heat sources were modeled as two parallel GaN strips with size of 0.5 μm (width)×0.1 μm (thickness)×50 μm (length) and spacing of 25 μm. The simulated structure consisted of 3.5 μm GaN, 15 μm PI, and 1 mm glass. The copper layer of the flexible GaN HEMT on engineered PI thin film was ~25 μm on the flat surface and ~10 μm on the sidewall. The temperature of the bottom surface of glass was set to room temperature (20° C.). Natural air convection was set on other surfaces.

Fabrication of microstrip transmission line: A PI/PMMA/Si substrate was prepared by spin-casting 7 layers of PI at 2500 rpm and cured in N2 atmosphere. Ti/Cu/Au (10/1400/100 nm) was deposited on the temporary substrate to form a signal path and coplanar ground for RF characterization. After lifting off the metal layer, the device was mechanically delaminated on a PDMS stamp, and the via was opened on the coplanar ground pads. The same copper electro-plating process was used to form the bottom ground plane.

Fabrication of flexible microwave amplifier: A thin-film GaN HEMT on a PDMS stamp, the same as the one used for RF characterization, was used for the fabrication of the flexible microwave amplifier. The HEMT was transfer-printed on a PI/PMMA/Si substrate using the same procedures as for fabricating the HEMT for thermal characterization. The encapsulating layer was spin-cast at 4000 rpm. After curing the PI layer, a layer of Ti/Au (10/100 nm) was deposited using electron-beam evaporation to form the bottom electrodes of the MIM capacitors. Two layers of PI were spin-cast at 4000 rpm to form a dielectric layer of MIM capacitors. A via was etched through the PI layer on top of the HEMT to expose electrodes of the HEMT for connection using RIE. A layer of metal (Ti/Cu/Au=10/1400/100 nm) was deposited using electron-beam evaporation and formed microstrip transmission lines, coplanar ground planes, and top electrodes of the MIM capacitors. The device was delaminated, and copper-coated TSV was formed using the same procedure as for producing the flexible HEMT on engineered PI thin-film.

Electrical characterization and analysis: DC characterization was carried out using a semiconductor parameter analyzer (HP4155B, Keysight). Small-signal RF characterization was carried out using a network analyzer (PNA 8364B, Keysignt) with a GSG probe ((Infinity Probe, Cascade Microtech), and DC bias was supplied by a semiconductor parameter analyzer (HP4155B, Keysight). The network analyzer and semiconductor parameter analyzer were controlled using a computer through software (ICCAP, Keysight). Large-signal continuous-wave RF characteristics of the flexible microwave amplifier were measured using the measurement setup shown in FIG. 10. The RF signal at 5 GHz was generated by a microwave signal generator (HP 83592B, Keysight). A DC power supply (Agilent E3631A, Keysight) was used to provide DC biases for the flexible amplifier. Input RF signal and DC bias for the gate electrode were combined through a bias tee (HP 11590B, Keysight) and applied on an input port of the flexible amplifier through a G-S-G microwave probe (Infinity Probe, Cascade Microtech). Amplified RF signal was sensed by a power sensor (HP 8481A, Keysight) and monitored by a microwave power meter (EPM-442A, Keysight) after de-coupling the DC bias for the drain electrode through a bias tee (HP 11590B, Keysight) and attenuation of a microwave attenuator (MOD 20600-6, Omni Spectra). Electromagnetic study about parasitic capacitance of the metal pads on various substrates and small-signal RF performance of the flexible microwave amplifier were carried out using Advanced Design System (ADS, Keysight).

The word "illustrative" is used herein to mean serving as an example, instance, or illustration. Any aspect or design described herein as "illustrative" is not necessarily to be construed as preferred or advantageous over other aspects or designs. Further, for the purposes of this disclosure and unless otherwise specified, "a" or "an" means "one or more."

The foregoing description of illustrative embodiments of the invention has been presented for purposes of illustration and of description. It is not intended to be exhaustive or to limit the invention to the precise form disclosed, and modifications and variations are possible in light of the above teachings or may be acquired from practice of the invention. The embodiments were chosen and described in order to explain the principles of the invention and as practical applications of the invention to enable one skilled in the art to utilize the invention in various embodiments and with various modifications as suited to the particular use contemplated. It is intended that the scope of the invention be defined by the claims appended hereto and their equivalents.

What is claimed is:

1. A heterojunction bipolar transistor comprising:
   a mesa stack comprising:
   optionally, a sub-collector;
   a collector;
   an emitter; and
   a base disposed between the collector and the emitter;
   a collector contact in electrical communication with the collector;
   an emitter contact over the emitter;
   a base contact in electrical communication with the base;
   a dielectric polymer that extends beneath and is in contact with a lower surface of the collector or, if present, the sub-collector, and encapsulates the mesa stack, wherein a via is defined in the dielectric polymer overlying the emitter, the via extending from an upper surface of the dielectric polymer to the emitter contact, such that a surface of the emitter contact is exposed through the via; and
   a thermally conductive film in contact with the upper surface of the dielectric polymer, sidewalls of the via, and the surface of the emitter contact that is exposed through the via.

2. The heterojunction bipolar transistor of claim 1, wherein the thermally conductive film comprises a material having a thermal conductivity of at least 50 $Wm^{-1}K^{-1}$.

3. The heterojunction bipolar transistor of claim 1, wherein the thermally conductive film comprises a material having a thermal conductivity of at least 200 $Wm^{-1}K^{-1}$.

4. The heterojunction bipolar transistor of claim 1, wherein the thermally conductive film comprises a material having a thermal conductivity of at least 300 $Wm^{-1}K^{-1}$.

5. The heterojunction bipolar transistor of claim 1, wherein the thermally conductive film is a metal film.

6. The heterojunction bipolar transistor of claim 5, wherein the metal film is a copper film.

7. The heterojunction bipolar transistor of claim 1, wherein the emitter has an emitter width and the via has a via width and further wherein the via width is in the range from 70% to 100% of the emitter width.

8. The heterojunction bipolar transistor of claim 1, wherein the base, the collector, and the emitter comprise Group III-V semiconductors.

9. The heterojunction bipolar transistor of claim 1, wherein the base, the collector, and the emitter comprise Group IV semiconductors.

10. The heterojunction bipolar transistor of claim 1, wherein the dielectric polymer has a dielectric constant of 4 or lower as measured at 1 kHz.

11. The heterojunction bipolar transistor of claim 1, wherein the thermally conductive material does not completely fill the via, but forms a conformal film on the sidewalls of the via and the exposed surface of the emitter contact.

12. A method of forming a heterojunction bipolar transistor, the method comprising:
    providing a transistor that includes: a mesa stack having:
    optionally, a sub-collector; a collector; an emitter; and a base disposed between the collector and the emitter;
    a collector contact in electrical communication with the collector; an emitter contact over the emitter; and a base contact in electrical communication with the base;
    disposing a dielectric polymer beneath and in contact with a lower surface of the collector or, if present, the sub-collector, and encapsulating the mesa stack with the dielectric polymer;
    forming a via in the dielectric polymer overlying at least a portion of the emitter, the via extending from an upper surface of the dielectric polymer to the emitter contact, such that a surface of the emitter contact is exposed through the via; and
    depositing a thermally conductive film on the upper surface of the dielectric polymer, sidewalls of the via, and the surface of the emitter that is exposed through the via.

13. The method of claim 12, wherein the thermally conductive film comprises a material having a thermal conductivity of at least 50 $Wm^{-1}K^{-1}$.

14. The method of claim 12, wherein the thermally conductive film comprises a material having a thermal conductivity of at least 200 $Wm^{-1}K^{-1}$.

15. The method of claim 12, wherein the thermally conductive film comprises a material having a thermal conductivity of at least 300 $Wm^{-1}K^{-1}$.

16. The method of claim 12, wherein the thermally conductive film is a metal film.

17. The method of claim 16, wherein the metal film is a copper film.

18. The method of claim 12, wherein the emitter has an emitter width and the via has a via width and further wherein the via width is in the range from 70% to 100% of the emitter width.

19. The method of claim 12, wherein the base, the collector, and the emitter comprise Group III-V semiconductors.

20. The method of claim 12, wherein the base, the collector, and the emitter comprise Group IV semiconductors.

21. The method of claim 12, wherein the dielectric polymer has a dielectric constant of 4 or lower as measured at 1 kHz.

22. The method of claim 12, wherein the thermally conductive material does not completely fill the via, but forms a conformal film on the sidewalls of the via and the exposed surface of the emitter contact.

* * * * *